United States Patent
Ochi et al.

(10) Patent No.: US 8,384,280 B2
(45) Date of Patent: Feb. 26, 2013

(54) REFLECTIVE ELECTRODE, DISPLAY DEVICE, AND METHOD FOR PRODUCING DISPLAY DEVICE

(75) Inventors: Mototaka Ochi, Kobe (JP); Hiroshi Goto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 68 days.

(21) Appl. No.: 12/681,542

(22) PCT Filed: Dec. 25, 2008

(86) PCT No.: PCT/JP2008/073655
§ 371 (c)(1),
(2), (4) Date: Apr. 2, 2010

(87) PCT Pub. No.: WO2009/081992
PCT Pub. Date: Jul. 2, 2009

(65) Prior Publication Data
US 2010/0231116 A1    Sep. 16, 2010

(30) Foreign Application Priority Data
Dec. 26, 2007  (JP) ................. 2007-335003

(51) Int. Cl.
*H01J 17/49* (2006.01)
*H01J 1/62* (2006.01)
*H01J 63/04* (2006.01)
(52) U.S. Cl. ............... 313/352; 455/1; 455/24; 455/25; 313/483; 313/500; 313/501; 313/502; 313/503; 313/504; 313/505; 313/506

(58) Field of Classification Search ........................ None
See application file for complete search history.

(56) References Cited

U.S. PATENT DOCUMENTS
(Continued)

FOREIGN PATENT DOCUMENTS

| CN | 1719320 A | 1/2006 |
|---|---|---|
| CN | 1822372 A | 8/2006 |

(Continued)

OTHER PUBLICATIONS

U.S. Appl. No. 13/122,937, filed Apr. 6, 2011, Nanbu, et al.

(Continued)

*Primary Examiner* — Natalie Walford
(74) *Attorney, Agent, or Firm* — Oblon, Spivak, McClelland, Maier & Neustadt, L.L.P.

(57) ABSTRACT

A reflective electrode (2) includes an aluminum alloy layer (2a) and an aluminum oxide layer (2b) arranged on or above a substrate and is directly connected to a transparent pixel electrode (3) without the interposition of a barrier metal layer. The aluminum alloy layer contains 0.1 to 2 atomic percent of nickel or cobalt and 0.1 to 2 atomic percent of lanthanum. The aluminum oxide layer has a ratio [O]/[Al] of the number of oxygen atoms [O] to the number of aluminum atoms [Al] of 0.30 or less. The aluminum oxide layer has a thickness in its thinnest portion of 10 nm or less. The reflective electrode has a high reflectance and a low contact resistance, even when subjected to a heat treatment at a low temperature of 100° C. or higher but 300° C. or lower. The reflective electrode also has excellent thermal stability and does not cause defects such as hillocks.

16 Claims, 9 Drawing Sheets

U.S. PATENT DOCUMENTS

| | | | |
|---|---|---|---|
| 5,514,909 | A | 5/1996 | Yamamoto et al. |
| 6,033,542 | A | 3/2000 | Yamamoto et al. |
| 6,096,438 | A | 8/2000 | Takagi et al. |
| 6,218,206 | B1 | 4/2001 | Inoue et al. |
| 6,252,247 | B1 | 6/2001 | Sakata et al. |
| 7,098,539 | B2 | 8/2006 | Gotoh et al. |
| 7,154,180 | B2 | 12/2006 | Gotoh et al. |
| 7,262,085 | B2 | 8/2007 | Gotoh et al. |
| 7,365,810 | B2 * | 4/2008 | Gotoh et al. .................. 349/43 |
| 7,411,298 | B2 | 8/2008 | Kawakami et al. |
| 7,553,754 | B2 | 6/2009 | Gotoh et al. |
| 7,622,809 | B2 * | 11/2009 | Gotoh et al. .................. 257/765 |
| 7,683,370 | B2 | 3/2010 | Kugimiya et al. |
| 7,994,503 | B2 * | 8/2011 | Hino et al. .................. 257/57 |
| 8,188,463 | B2 * | 5/2012 | Aurongzeb et al. ............ 257/40 |
| 2003/0047812 | A1 | 3/2003 | Hagihara et al. |
| 2004/0126608 | A1 | 7/2004 | Gotoh et al. |
| 2005/0140877 | A1 | 6/2005 | Jeoung et al. |
| 2005/0224795 | A1 | 10/2005 | Gotoh et al. |
| 2006/0007366 | A1 | 1/2006 | Gotoh et al. |
| 2006/0091792 | A1 | 5/2006 | Kugimiya et al. |
| 2006/0180250 | A1 | 8/2006 | Kugimiya et al. |
| 2006/0181198 | A1 | 8/2006 | Gotoh et al. |
| 2006/0275618 | A1 | 12/2006 | Kugimiya et al. |
| 2007/0278497 | A1 | 12/2007 | Kawakami et al. |
| 2008/0081532 | A1 | 4/2008 | Okuno |
| 2008/0121522 | A1 | 5/2008 | Ehira et al. |
| 2008/0223718 | A1 | 9/2008 | Takagi et al. |
| 2008/0315203 | A1 | 12/2008 | Hino et al. |
| 2009/0001373 | A1 | 1/2009 | Ochi et al. |
| 2009/0004490 | A1 | 1/2009 | Gotou et al. |
| 2009/0011261 | A1 | 1/2009 | Gotou |
| 2009/0026072 | A1 | 1/2009 | Takagi et al. |
| 2009/0133784 | A1 | 5/2009 | Kugimiya et al. |
| 2009/0176113 | A1 | 7/2009 | Gotoh et al. |
| 2009/0242394 | A1 | 10/2009 | Takagi et al. |
| 2010/0012935 | A1 | 1/2010 | Hino et al. |
| 2010/0032186 | A1 | 2/2010 | Gotou et al. |
| 2010/0065847 | A1 | 3/2010 | Gotou et al. |
| 2010/0231116 | A1 | 9/2010 | Ochi et al. |
| 2012/0064370 | A1 * | 3/2012 | Tanifuji et al. .................. 428/687 |
| 2012/0091591 | A1 * | 4/2012 | Gotoh et al. .................. 257/765 |

FOREIGN PATENT DOCUMENTS

| | | |
|---|---|---|
| JP | 11 283934 | 10/1999 |
| JP | 11 284195 | 10/1999 |
| JP | 11 337976 | 12/1999 |
| JP | 2003 273109 | 9/2003 |
| JP | 2004 144826 | 5/2004 |
| JP | 2004 214606 | 7/2004 |
| JP | 2005 91477 | 4/2005 |
| JP | 2005 196172 | 7/2005 |
| JP | 2005 303003 | 10/2005 |
| JP | 2006 23388 | 1/2006 |
| JP | 2006 261636 | 9/2006 |
| JP | 2007 157917 | 6/2007 |
| JP | 2007 304384 | 11/2007 |
| JP | 2008 122941 | 5/2008 |
| KR | 10-2006-0049854 | 5/2006 |
| KR | 10-2006-0092145 | 8/2006 |

OTHER PUBLICATIONS

U.S. Appl. No. 13/126,126, filed Apr. 26, 2011, Ochi, et al.
U.S. Appl. No. 13/144,716, filed Jul. 15, 2011, Goto, et al.
U.S. Appl. No. 13/254,316, filed Sep. 1, 2011, Kobayashi, et al.
U.S. Appl. No. 12/999,034, filed Dec. 14, 2010, Kawakami, et al.
U.S. Appl. No. 13/056,444, filed Jan. 28, 2011, Onishi, et al.
U.S. Appl. No. 12/918,727, filed Aug. 20, 2010, Miki, et al.
U.S. Appl. No. 12/922,764, filed Sep. 15, 2010, Goto, et al.
U.S. Appl. No. 12/922,965, filed Sep. 16, 2010, Nakai, et al.
U.S. Appl. No. 12/936,572, filed Oct. 6, 2010, Kawakami, et al.
Office Action issued on Jul. 28, 2011 in the corresponding Korean Patent Application No. 10-2010-7011457 (with English Translation).
U.S. Appl. No. 12/444,267, filed Apr. 3, 2009, Hino, et al.
U.S. Appl. No. 12/376,863, filed Feb. 9, 2009, Hino, et al.
U.S. Appl. No. 13/387,522, filed Jan. 27, 2012, Goto, et al.
U.S. Appl. No. 13/387,557, filed Jan. 27, 2012, Maeda, et al.
U.S. Appl. No. 13/320,673, filed Nov. 15, 2011, Tanifuji, et al.
U.S. Appl. No. 13/286,284, filed Nov. 1, 2011, Gotoh, et al.
Taiwanese Office Action issued Jul. 16, 2012, in Taiwan Patent Application No. 097151058 (with English translation).
U.S. Appl. No. 13/581,436, filed Aug. 27, 2012, inventor Iwasaki, et al.

* cited by examiner

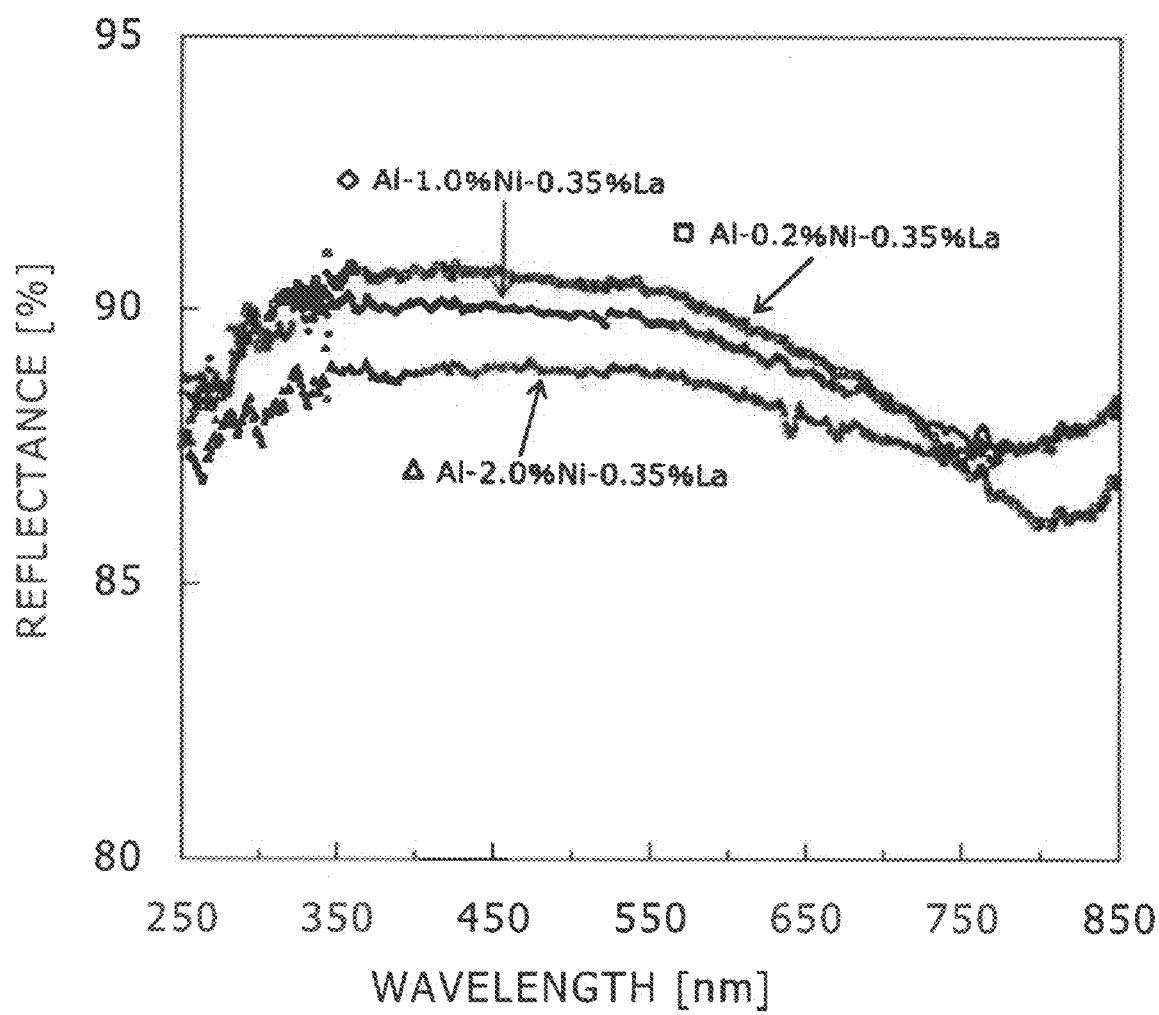

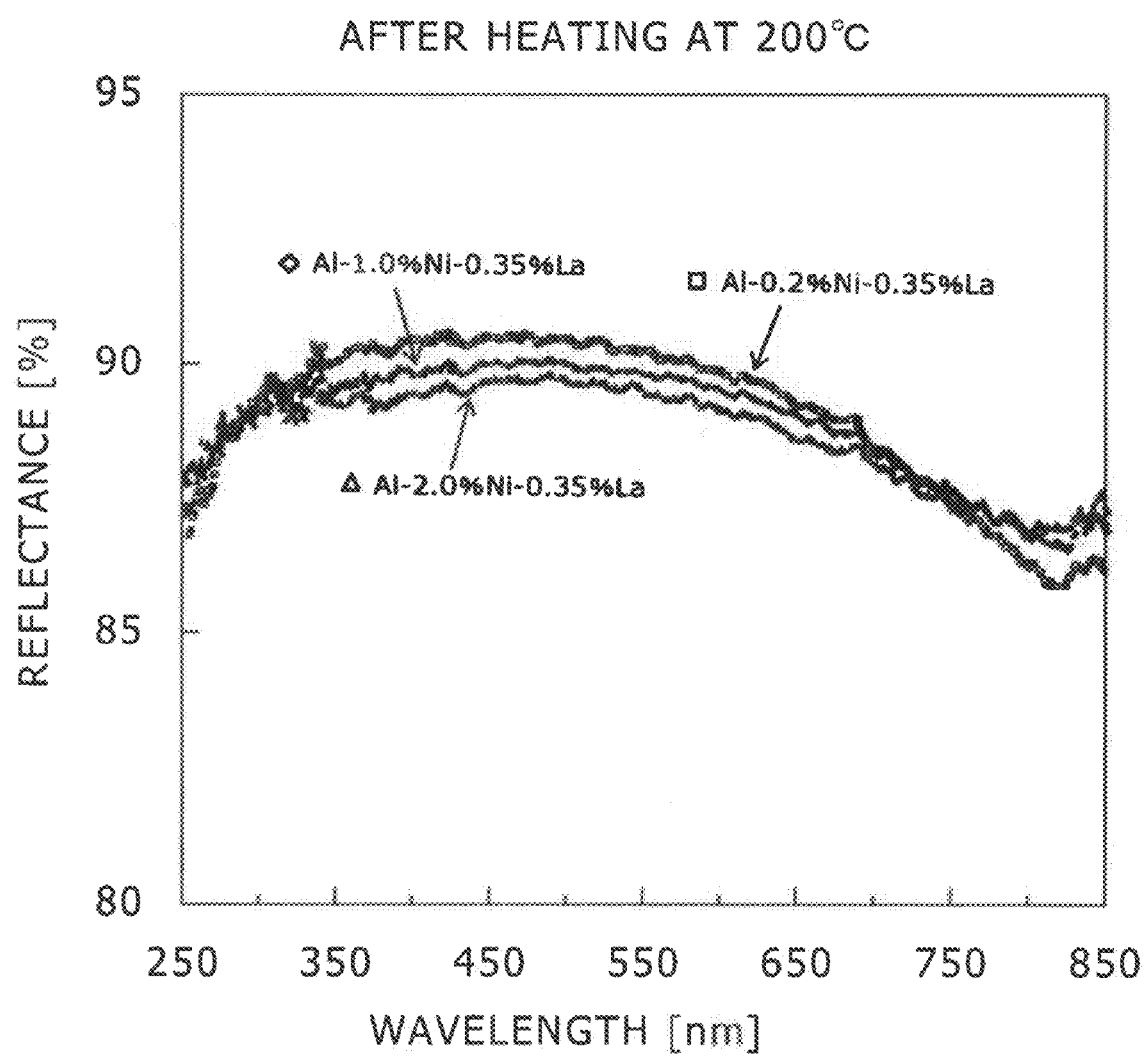

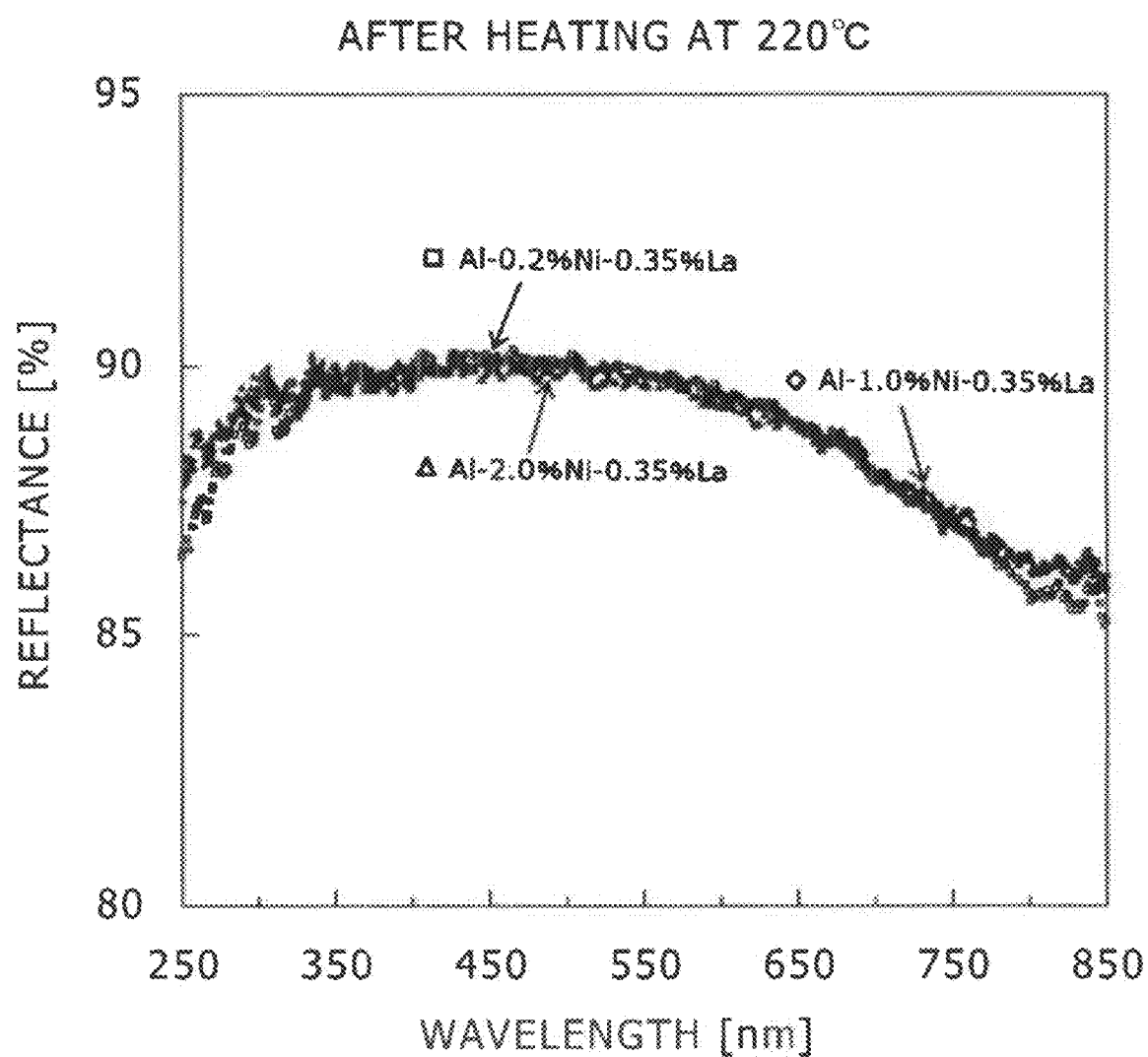

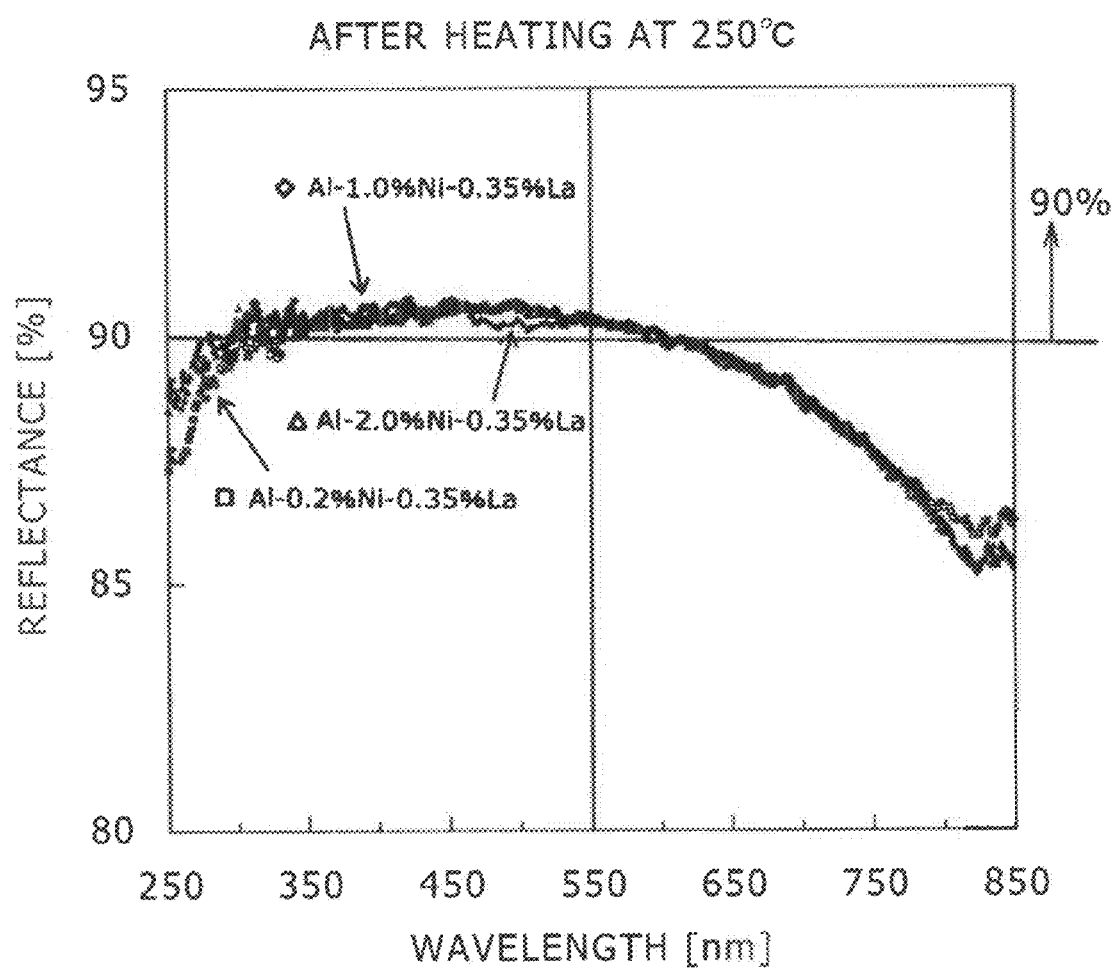

REFLECTIVE ELECTRODE, DISPLAY DEVICE, AND METHOD FOR PRODUCING DISPLAY DEVICE

TECHNICAL FIELD

The present invention relates to reflective electrode for use in display devices represented by liquid crystal displays and organic electroluminescent (EL) displays; to display devices including the reflective electrodes; and production methods of the display devices. Hereinafter the present invention will be illustrated by taking liquid crystal displays as representative examples; but it should be noted that these are never construed to limit the scope of the present invention.

BACKGROUND ART

Liquid crystal displays are broadly grouped under transmissive display devices, reflective display devices, and semi-transmissive display devices. The transmissive display devices adopt, as a light source, light from a lighting unit (back light) arranged at the rear of a liquid crystal panel. The reflective display devices adopt, as a light source, surrounding light. The semi-transmissive display devices have properties both as transmissive ones and reflective ones.

Of these, the transmissive display devices create a display by allowing back light irradiated from the rear side of the liquid crystal panel to pass through the liquid crystal panel and a color filter and thereby have advantages such that a display can be indicated at a high contrast ratio without being affected by the environment of use. They are generally used in large-sized electronic appliances which require satisfactory brightness, such as television sets and personal computer monitors. However, they are somewhat unsuitable for small appliances such as cellular phones, because they require power for the back light.

In contrast, the reflective display devices create a display by allowing natural light or artificial light to reflect in a liquid crystal panel and allowing the reflected light to pass through the liquid crystal panel and a color filter. They do not need the back light and are thereby generally used typically in electronic desk calculators and clocks (or watches). The reflective display devices, however, are disadvantageous in that the brightness and contrast ratio of the display are largely affected by the surrounding environment upon use and, in particular, it is difficult to see the display in dark surroundings.

In contrast to these, the semi-transmissive display devices create a display both by a transmissive mode and a reflective mode according to the surroundings upon use. Typically, they use a reflective electrode to save electrical power consumption in daytime, but they allow the back light to illuminate to create a display according to necessity in a room or at nighttime. They are therefore advantageous in that they can save the electrical power consumption without being limited by the surrounding environment and can create a display at a high contrast ratio. The semi-transmissive display devices are therefore optimally used in mobile devices and are generally used particularly typically in colorized cellular phones.

The structure (configuration) and operating principles of a representative semi-transmissive liquid crystal display device will be illustrated with reference to FIG. 1 and FIG. 2. FIG. 1 and FIG. 2 correspond to FIG. 1 and FIG. 2 disclosed in Patent Document 3 mentioned below.

With reference to FIG. 1, a semi-transmissive liquid crystal display device 11 includes a thin film transistor (hereinafter referred to as TFT) substrate 21; a counter substrate 15 arranged so as to face the TFT substrate 21; and a liquid crystal layer 23 arranged between the TFT substrate 21 and the counter substrate 15 and functions as an optical modulation layer. The counter substrate 15 includes a color filter 17 including a black matrix 16; and a transparent common electrode 13 is arranged on the color filter 17. Independently, the TFT substrate 21 includes pixel electrodes 19, switching elements T, and a wiring part including scanning lines and signal lines. In the wiring part, two or more gate wirings 5 and two or more data wirings 7 are arranged perpendicularly to each other. TFTs as switching elements (indicated as "T" in the figure) are arranged in matrix at intersecting portions where the gate wirings 5 and the data wirings 7 intersect each other.

As is illustrated in detail in FIG. 2, pixel areas P of the pixel electrodes 19 each include a transmissive area A and a reflective area C. A transparent electrode (pixel electrode) 19a is present both in the transmissive area A and the reflective area C; and a reflective electrode 19b is present in the reflective area C. A barrier metal layer 51 is arranged between the transparent electrode 19a and the reflective electrode 19b. The barrier metal layer 51 is made from a high-melting-point metal such as Mo, Cr, Ti, or W. This layer will be illustrated in detail later.

The operating principles of transmissive mode and reflective mode of the semi-transmissive liquid crystal display device 11 shown in FIG. 1 will be illustrated with reference to FIG. 2.

Initially, the operating principles of transmissive mode will be illustrated.

In the transmissive mode, light F from a back light 41 arranged below the TFT substrate 21 is used as a light source. The light emitted from the back light 41 passes through the transparent electrode 19a and the transmissive area A and enters the liquid crystal layer 23. An electric field formed between the transparent electrode 19a and the common electrode 13 controls the alignment direction of liquid crystal molecules in the liquid crystal layer 23; whereby the incident light F emitted from the back light 41 and passing through the liquid crystal layer 23 is modulated. This controls the quantity of light passing through the counter substrate 15 to create a display of image.

In contrast, external natural light or artificial light B is used as a light source in the reflective mode. The light B coming into the counter substrate 15 is reflected by the reflective electrode 19b. An electric field formed between the reflective electrode 19b and the common electrode 13 controls the alignment direction of liquid crystal molecules in the liquid crystal layer 23, whereby the light B passing through the liquid crystal layer 23 is modulated. This controls the quantity of light passing through the counter substrate 15 to create a display of image.

The pixel electrode 19 includes the transparent electrode 19a and the reflective electrode 19b. Of these, the transparent electrode 19a is formed representatively from an electroconductive oxide film typically of an indium tin oxide (ITO) or indium zinc oxide (IZO). The indium tin oxide (ITO) contains indium oxide (In $O_3$) and about 10 percent by mass of tin oxide (Sn). The indium zinc oxide (IZO) contains indium oxide and about 10 percent by mass of zinc oxide.

The reflective electrode 19b is made from a metal material having a high reflectance represented by pure aluminum or an aluminum alloy such as Al—Nd (hereinafter these are synthetically referred to as "aluminum-based alloy"). Aluminum (Al) has also a low electric resistivity and is thereby very useful as a wiring material.

With reference to FIG. 2, the barrier metal layer 51 made from a high-melting-point metal such as molybdenum (Mo)

is arranged between the aluminum-based alloy thin film constituting the reflective electrode 19b and the electroconductive oxide film, such as ITO or IZO, constituting the transparent electrode. This is because, if these films are directly connected to each other to form a reflective area, the contact resistance increases due typically to galvanic corrosion to thereby impair the display quality on the screen. Specifically, this problem occurs probably for the following reasons. Aluminum is very susceptible to oxidation. In addition, there is a large difference in electrode potential in an alkaline electrolyte (developer) between pure aluminum and the electroconductive oxide film; namely, pure aluminum has an electrode potential of −1.9 V, and in contrast, ITO has an electrode potential of −0.17 V. Accordingly, if the aluminum-based alloy thin film is directly connected to the electroconductive oxide film, an aluminum oxide insulating layer is formed at the interface between the two films by the action of oxygen formed or added during the deposition processes in the liquid crystal panel, and the aluminum oxide insulating layer may invite the above problem.

Based on this viewpoint, the techniques disclosed in Patent Document 1 to Patent Document 3, for example, have attempted to reduce the contact resistance by arranging a barrier metal layer made typically of No or chromium (Cr) between an aluminum-based alloy layer and a transparent pixel electrode (made typically of ITO).

Patent Document 1: Japanese Unexamined Patent Application Publication (JP-A) No. 2004-144826

Patent Document 2: Japanese Unexamined Patent Application Publication (JP-A) No. 2005-91477

Patent Document 3: Japanese Unexamined Patent Application Publication (JP-A) No. 2005-196172

DISCLOSURE OF INVENTION

Problems to be Solved by the Invention

The wiring material constituting the reflective electrode should spontaneously have, as required properties, a high reflectance and a low electric resistivity. However, the high-melting-point metals such as Mo and Cr have very low reflectances. Accordingly, when the reflective area is constituted typically by the refection at the interface between the transparent pixel electrode and the aluminum-based alloy layer, one should take the trouble to remove the barrier metal layer to thereby expose the aluminum-based alloy layer, when a display is to be created according to the reflective mode.

In addition, strong demands have been made to develop wiring materials for reflective electrodes, which can reduce the contact resistance even when omitting the barrier metal layer. These demands have been made from the viewpoints typically of productivity and production cost. This is because the deposition of the barrier metal layer needs extra installation of a deposition chamber for the deposition of the barrier metal, in addition to a deposition sputtering system required for the deposition of the transparent pixel electrode; but such increase in production cost and decrease in productivity accompanied with the formation of the barrier metal layer become not neglectable as the cost reduction proceeds with commercial production of such liquid crystal panels.

The use of barrier metal layer further increases the cost. Specifically, when the multilayer wiring including the barrier metal layer and the aluminum-based alloy layer is to be tapered through wet etching process, two types of etchants (etching solutions) for the barrier metal and for the aluminum-based alloy should be prepared respectively, and, in addition, two types of etching baths should be prepared.

Furthermore, according to recent techniques, such a wiring material constituting the reflective electrode is deposited at lower temperatures than before. Accordingly, the wiring material should excel in the properties (high reflectance, low electric resistivity, and low contact resistance) after a heat treatment for deposition and should have such superior thermal stability as not to cause hillocks (nodular protrusions) on the surface of wiring, even when the deposition is conducted through a heat treatment at low temperatures typically of from about 100° C. to about 300° C. This is because the process temperatures for the production of display devices become lower and lower to improve, for example, yield and productivity; and the deposition of such wiring material can be performed, for example, at about 250° C. as a result of recent improvements in deposition technologies.

However, there has not yet been provided a wiring material for reflective electrode, which has the required properties simultaneously and can be connected directly to the transparent pixel electrode.

The above explanation has been made by taking the semi-transmissive display device as an example; however, the above-described requirements are not limited thereto and are adopted to all display devices having a reflective area in which a display is created according to the reflective mode.

The present invention has been made while focusing attention on these circumstances, and it is an object of the present invention to provide a reflective electrode which includes a metal layer (Al alloy thin film) to be directly connected to an electroconductive oxide film constituting a transparent electrode without the interposition of a barrier metal layer, which has a high reflectance and a low contact resistance even after subjected to a heat treatment at low temperatures typically of about 100° C. or higher and 300° C. or lower, and which has such superior thermal stability as not to cause defects such as hillocks. Another object of the present invention is to provide a display device provided with the reflective electrode; and a production method of the display device.

Means for Solving the Problems

The present invention has achieved the above objects and provides a reflective electrode for a display device, to be arranged on or above a substrate, the reflective electrode includes a first Al—(Ni/Co)—X alloy layer containing 0.1 to 2 atomic percent of at least one of nickel (Ni) and cobalt (Co), and 0.1 to 2 atomic percent of X, wherein X is at least one element selected from the group consisting of La, Mg, Cr, Mn, Ru, Rh, Pt, Pd, Ir, Ce, Pr, Gd, Tb, Dy, Nd, Ti, Zr, Nb, Mo, Hf, Ta, W, Y, Fe, Sm, Eu, Ho, Er, Tm, Yb, and Lu; and a second aluminum oxide layer containing aluminum (Al) and oxygen (O), in which the second aluminum oxide layer is to be directly connected to a transparent pixel electrode, the second aluminum oxide layer has a ratio [O]/[Al] of the number of oxygen atoms to the number of aluminum atoms of 0.30 or less, the second aluminum oxide layer has a thickness in its thinnest portion of 10 nm or less, and the reflective electrode is to be present between the transparent pixel electrode and the substrate in a region where the second aluminum oxide layer and the transparent pixel electrode are directly connected to each other.

In a preferred embodiment, the first Al—(Ni/Co)—X alloy layer contains 0.1 to 2 atomic percent of at least one of Ni and Co; and 0.1 to 2 atomic percent of La.

In another preferred embodiment, the first Al—(Ni/Co)—X alloy layer contains 0.1 to 2 atomic percent of Ni; and 0.1 to 2 atomic percent of at least one of La and Nd.

In yet another preferred embodiment, the first Al—(Ni/Co)—X alloy layer further contains 0.1 to 2 atomic percent of Z, wherein Z is at least one element selected from the group consisting of Ge, Cu, and Si.

In still another preferred embodiment, the first Al—(Ni/Co)—X alloy layer contains 0.1 to 2 atomic percent of at least one of Ni and Co; 0.1 to 2 atomic percent of La; and 0.1 to 2 atomic percent of at least one of Ge and Cu.

In another preferred embodiment, the first Al—(Ni/Co)—X alloy layer contains 0.1 to 2 atomic percent of Ni; 0.1 to 2 atomic percent of at least one of La and Nd; and 0.1 to 2 atomic percent of at least one of Ge and Cu.

The above-mentioned transparent pixel electrode preferably includes at least one of an indium tin oxide (ITO) and an indium zinc oxide (IZO).

The present invention further provides a display device including any of the reflective electrodes mentioned above.

Such a display device including the reflective electrode according to the present invention can be produced by any of the following three methods.

A first production method sequentially includes the steps of depositing an Al—Ni—X alloy layer or Al—(Ni/Co)—X alloy layer on or above a substrate through sputter deposition; subjecting the deposited Al—Ni—X alloy layer or Al—(Ni/Co)—X alloy layer to a heat treatment at a temperature of 200° C. or higher in an atmosphere of a vacuum or an inert gas; and depositing a transparent pixel electrode through sputter deposition.

A second production method sequentially includes the steps of depositing an Al—Ni—X alloy layer or Al—(Ni/Co)—X alloy layer on or above a substrate through sputter deposition; and depositing a transparent pixel electrode on or above the deposited Al—Ni—X alloy layer or Al—(Ni/Co)—X alloy layer through sputter deposition, wherein the sputter deposition is performed in a deposition atmosphere containing a nitrogen component at least in the early stage of the sputter deposition.

A third production method sequentially includes the steps of depositing an Al—Ni—X alloy layer or Al—(Ni/Co)—X alloy layer on or above a substrate through sputter deposition; subjecting the deposited Al—Ni—X alloy layer or Al—(Ni/Co)—X alloy layer to reverse sputtering; and depositing a transparent pixel electrode through sputter deposition.

In the first to third production methods, the Al—Ni—X alloy layer or Al—(Ni/Co)—X alloy layer preferably further contains 0.1 to 2 atomic percent of Z, wherein Z is at least one element selected from the group consisting of Ge, Cu, and Si.

EFFECTS OF THE INVENTION

The reflective electrodes according to the present invention each have an aluminum oxide layer containing O (oxygen) in a less amount and being thin in a contact area with the transparent pixel electrode. They therefore excel in all properties such as reflection properties, contact resistance, electric resistivity, and thermal stability even when the aluminum oxide layer constituting the reflective electrodes is directly connected to the electroconductive oxide film constituting the transparent electrode without the interposition of a barrier metal layer, in contrast to common techniques. Specifically, for example, the reflective electrodes have high reflectances and low contact resistances and do not cause defects such as hillocks even after subjected to a heat treatment at a low temperature of about 100° C. or higher and 300° C. or lower. Accordingly, the reflective electrodes according to the present invention, when used, can provide display devices having excellent productivity, being inexpensive, and showing high performance.

BRIEF DESCRIPTION OF DRAWINGS

FIG. 6 is a graph showing how the reflectances of different reflective electrodes vary immediately after deposition.

FIG. 7 is a graph showing how the reflectances of different reflective electrodes vary after heating at 200° C. in vacuo.

FIG. 8 is a graph showing how the reflectances of different reflective electrodes vary after heating at 220° C. in vacuo.

FIG. 9 is a graph showing how the reflectances of different reflective electrodes vary after heating at 250° C. in vacuo.

Figure 1:
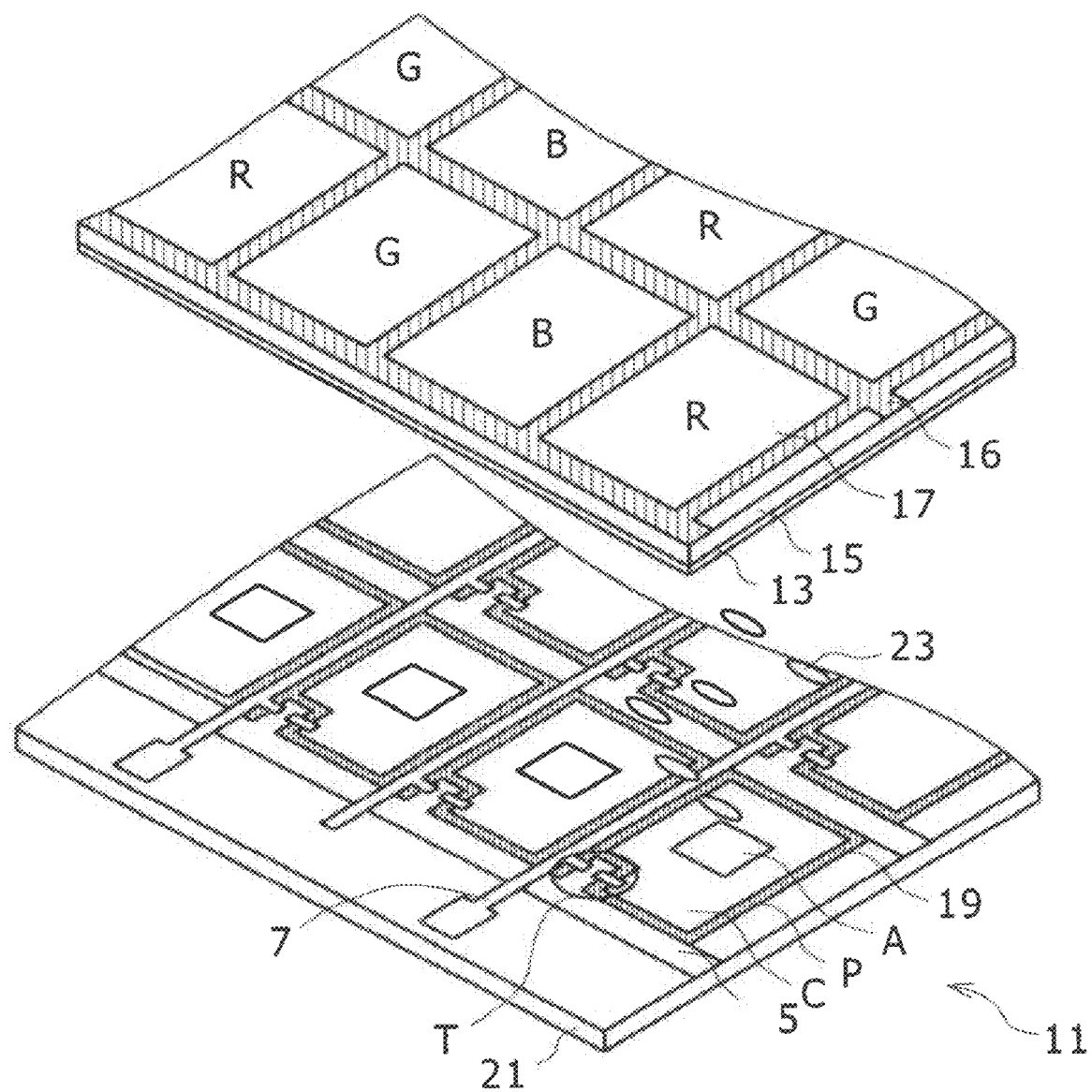
FIG. 1 is an exploded perspective view illustrating the structure of a representative semi-transmissive liquid crystal display device.
Figure 2:
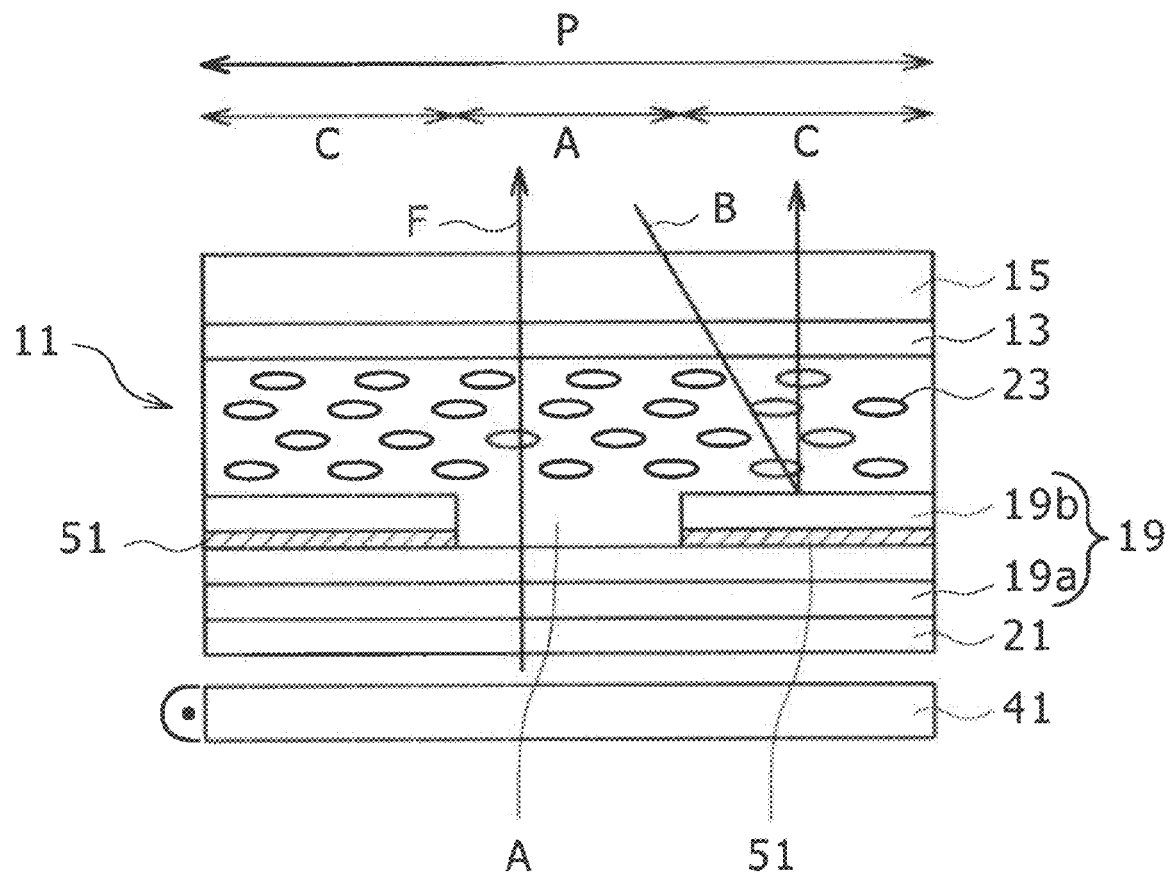
FIG. 2 is a schematic cross-sectional view of the representative semi-transmissive liquid crystal display device.

| Reference Numerals | |
|---|---|
| 1 | substrate |
| 2a | first layer (Al—Ni—La alloy layer) |
| 2b | second layer (aluminum oxide layer: $AlO_x$, $x \leq 0.30$) |
| 2 | reflective electrode |
| 3 | transparent pixel electrode (e.g., ITO) |
| 5 | gate wiring |
| 7 | data wiring |
| 8 | gate electrode |
| 9 | source electrode |
| 10 | drain electrode |
| 11 | semi-transmissive liquid crystal display device |
| 13 | common electrode |
| 15 | counter substrate |
| 16 | black matrix |
| 17 | color filter |
| 19 | pixel electrode |
| 19a | transparent electrode (pixel electrode) |
| 19b | reflective electrode |
| 21 | TFT substrate |
| 23 | liquid crystal layer |
| 24 | source region |
| 25 | drain region |
| 26 | channel layer |
| 27 | gate insulating film |
| 51 | barrier metal layer |
| T | switching element (TFT) |

BEST MODES FOR CARRYING OUT THE INVENTION

The present inventors made intensive investigations to provide a reflective electrode which exhibits excellent reflection properties even without arranging a barrier metal layer between an electroconductive oxide film constituting the transparent pixel electrode and a metal thin film constituting the reflective electrode, in contrast to common techniques;

which surely maintains satisfactory reflection properties even after subjected to a heat treatment at low temperatures; and which excels also in other properties such as contact resistance and electric resistivity.

As a result, the present inventors found that the use of a multi-component alloy material represented by an Al—Ni alloy gives a reflective electrode which has properties such as low contact resistance without the interposition of a barrier metal layer; and based on these findings, they filed a patent application in Japan (Japanese Patent Application No. 2007-268313). More specifically, they found (i) that the above objects are achieved by using an Al—Ni alloy containing 0.1 to 2 atomic percent of Ni as an Al alloy; (ii) that the thermal stability is further increased by using an Al—Ni—X alloy corresponding to the Al—Ni alloy, except for further containing 0.1 to 2 atomic percent of at least one element selected from the group consisting of La, Mg, Cr, Mn, Ru, Rh, Pt, Pd, Ir, Ce, Pr, Gd, Tb, Dy, Nd, Ti, Zr, Nb, Mo, Hf, Ta, W, Y, Fe, Co, Sm, Eu, Ho, Er, Tm, Yb, and Lu (hereinafter this group is also referred to as Group X for the sake of convenience in explanation); and (iii) that properties such as reflectance, contact resistance, and thermal stability are further improved by using an Al—Ni—X—Z alloy corresponding to the Al—Ni—X alloy, except for further containing 0.1 to 2 atomic percent of at least one element selected from the group consisting of Si and/or Ge (hereinafter this group is also referred to as Group Z for the sake of convenience in explanation).

The present inventors have continued further investigations to further reduce the contact resistance even after the filing of the patent application. As a result, they have found that a reflective electrode having a further lower contact resistance than that of a common Al alloy layer is obtained by forming, on an Al—Ni—X alloy layer, an aluminum oxide layer containing a lower amount of oxygen ($AlO_x$, $x \leq 0.30$) than that of $Al_2O_3$ ($AlO_{4.5}$) and having a small thickness (the thickness of its thinnest portion is equal to or less than 10 nm). The present invention has been made based on these findings. The present invention have also found that Co can be used instead of Ni in the Al—Ni—X alloy layer and that Co is an equieffective element showing similar effects to those of Ni. Each of Ni and Co can be used alone or in combination. The present inventors have further found that Group Z (Si and/or Ge), which may be contained in the alloy layer as described above, may further include Cu. Specifically, they have found that the alloy layer may further contain 0.1 to 2 atomic percent of Group Z, wherein Group Z is at least one element selected from the group consisting of Ge, Cu, and Si, and this further effectively reduces the contact resistance.

Hereinafter, an Al alloy containing Ni and/or Co and at least one of Group X is also referred to as an Al—(Ni/Co)—X alloy. An Al alloy corresponding to the Al—(Ni/Co)—X alloy, except for further containing at least one of Group Z, is also referred to as an Al—(Ni/Co)—X—Z alloy. In addition, these Al alloys are also generically referred to as Al—(Ni/Co)—X—(Z) alloys.

The reflective electrode can have a lower contact resistance by forming a specific aluminum oxide layer on an Al—(Ni/Co)—X—(Z) alloy layer, as is demonstrated in experimental examples mentioned later, which aluminum oxide layer contains oxygen in a less amount and has a small thickness in its thinnest portion ($AlO_x$, $x \leq 0.30$, thickness in its thinnest portion being equal to or less than 10 nm). A presumed mechanism for this is as follows. The previously formed aluminum oxide layer containing oxygen in a less amount probably suppresses the interdiffusion of aluminum (Al) and oxygen (O) at the interface where the transparent pixel electrode (e.g., ITO) and the reflective electrode are in contact with each other. This probably inhibits the formation of an aluminum oxide layer containing oxygen in a large amount and having a large thickness to thereby have a high contact resistance ($AlO_x$, $x>0.30$, thickness in its thinnest portion is more than 10 nm). The present invention, however, is not limited to the presumed mechanism.

As used herein the term "high reflectance" or "excel in reflection properties" means that a reflective electrode in question has a reflectance at 550 nm of 90% or more both immediately after deposition and after a heating treatment, as measured according to the method described in the after-mentioned experimental examples.

Also as used herein the term (having) "a low contact resistance" means that a reflective electrode in question has a contact resistance of 1 kΩ or less in a 100-µ square contact hole both immediately after deposition and after a heating treatment, as measured according to the method described in the after-mentioned experimental examples. The lower the contact resistance is, the better; and the contact resistance is preferably about 500Ω or less, and more preferably about 100Ω or less.

Figure 3:
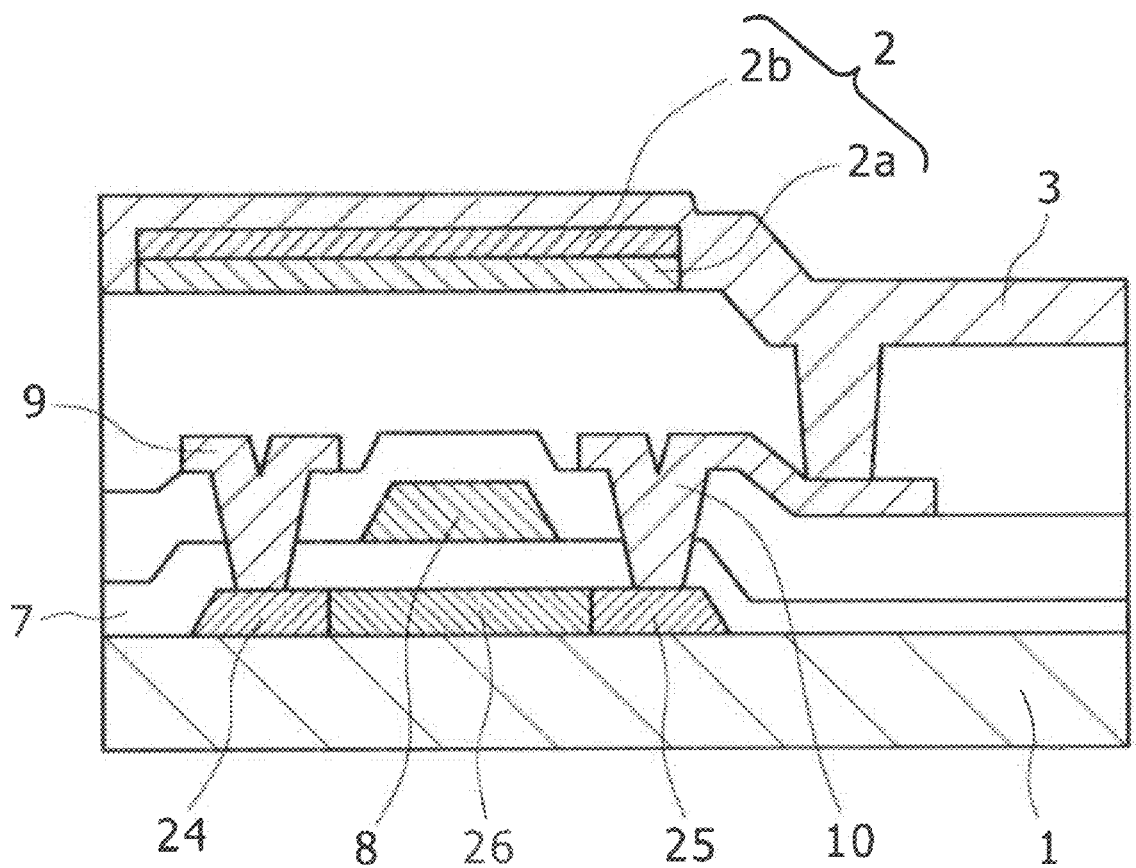
FIG. 3 is a cross-sectional view of the principal part of a display device having a reflective electrode according to the present invention.

A Reflective electrode according to the present invention will be illustrated below in detail with reference to FIG. 3.

As is described above, the reflective electrode according to the present invention includes a first Al—(Ni/Co)—X alloy layer 2a; and a second aluminum oxide layer 2b containing aluminum (Al) and oxygen (O). The second aluminum oxide layer 2b is directly connected to a transparent pixel electrode 3. The reflective electrode according to the present invention is arranged between the transparent pixel electrode 3 and a substrate 1 in a region where the second aluminum oxide layer 2b and the transparent pixel electrode 3 are directly connected to each other.

The reflective electrode according to the present invention is characterized by having, on the Al—(Ni/Co)—X alloy layer (first layer), the aluminum oxide layer (second layer) containing oxygen in a less amount and having a small thickness in its thinnest portion. Specifically, in the reflective electrode, not the Al—(Ni/Co)—X alloy layer as the first layer but the aluminum oxide layer as the second layer is directly connected to the transparent pixel electrode.

More specifically, the second aluminum oxide layer has a ratio [O]/[Al] of the number of oxygen atoms to the number of aluminum atoms in the aluminum oxide layer of 0.30 or less, preferably 0.25 or less, and more preferably 0.20 or less. The aluminum oxide layer has a thickness in its thinnest portion of 10 nm or less, preferably 8 nm or less, and more preferably 6 nm or less.

The elements Ni and Co in the first Al—(Ni/Co)—X alloy layer are useful to lower the contact resistance. The Al—(Ni/Co)—X alloy layer may contain either one or both of these elements (Ni and Co). However, these elements, if contained in an excessively large total amount (the amount of one element if contained alone), may lower the reflectance of the Al alloy layer. Accordingly, the total content of (Ni and/or Co) (or Ni content or Co content if contained alone) in the Al—(Ni/Co)—X alloy layer is herein set to be 0.1 atomic percent or more (preferably 0.3 atomic percent or more, and more preferably 0.5 atomic percent or more) and 2 atomic percent or less (preferably 1.5 atomic percent or less, and more preferably 1.0 atomic percent or less).

The component X in the first Al—(Ni/Co)—X alloy layer is at least one element selected from the group consisting of La, Mg, Cr, Mn, Ru, Rh, Pt, Pd, Ir, Ce, Pr, Gd, Tb, Dy, Nd, Ti, V, Zr, Nb, Mo, Hf, Ta, W, Y, Fe, Sm, Eu, Ho, Er, Tm, Yb, and Lu. Each of these elements is effective as an element for improving the thermal stability and effectively prevents the formation of hillocks (nodular protrusions) on the surface of the aluminum-based alloy thin film.

The component X, if its content is less than 0.1 atomic percent, does not effectively help to improve the thermal stability. From the viewpoint of the thermal stability alone, the larger the content of X is, the better. However, the component X, if contained in a content of more than 2 atomic percent, may cause the Al—(Ni/Co)—X alloy film itself to have a higher electric resistivity. Accordingly, in consideration both of the reduction in electric resistivity and of the improvement in thermal stability, the X content is preferably 0.2 atomic percent or more and 0.8 atomic percent or less. Each of these elements may be added alone or in combination. When two or more of these elements are added in combination, the total content of respective elements has only to be controlled to fall within the above range.

Of the elements belonging to Group X, preferred from the viewpoint of improvement in thermal stability are Cr, Ru, Rh, Pt, Pd, Ir, Dy, Zr, Nb, Mo, Hf, Ta, W, Y, Fe, Co, Eu, Ho, Er, Tm, and Lu; of which Ir, Nb, Mo, Hf, Ta, and W are more preferred. Independently, preferred in consideration of not only improvement in thermal stability but also reduction in electric resistivity are La, Cr, Mn, Ce, Pr, Gd, Tb, Dy, Nd, Zr, Nb, Hf, Ta, Y, Sm, Eu, Ho, Er, Tm, Yb, and Lu; of which La, Gd, Tb, Mn, and Nd are more preferred; of which La and Nd are most preferred. Accordingly, an alloy layer containing 0.1 to 2 atomic percent of Ni and/or Co; and 0.1 to 2 atomic percent of La and/or Nd is most preferred as the Al—(Ni/Co)—X alloy layer herein.

The remainder of the Al—(Ni/Co)—X alloy layer herein substantially includes aluminum (Al) and inevitable impurities.

The Al—(Ni/Co)—X alloy layer may further contain 0.1 to 2 atomic percent of Z, wherein Z is at least one element selected from the group consisting of Ge, Cu, and Si. This further improves the contact resistance, electric resistivity, and thermal stability.

The component Z, if its content is less than 0.1 atomic percent, does not effectively exhibit the activities. In contrast, the component Z, if its content exceeds 2 atomic percent, exhibits the activities more effectively, but causes a lower reflectance and/or a higher electric resistivity. The Z content is preferably 0.2 atomic percent or more and 0.8 atomic percent or less. Each of the elements Ge, Cu, and Si belonging to Group Z may be added alone or in combination. When two or more of these elements are added in combination, the total content of respective elements has only to be controlled to fall within the above range.

Of Group Z elements, preferred from the viewpoint of improvement in contact resistance with the transparent electroconductive film are Ge and Cu. The use of Ge and/or Cu also improves resistance to bases. Accordingly, an alloy layer containing 0.1 to 2 atomic percent of Ni and/or Co; 0.1 to 2 atomic percent of La and/or Nd; and 0.1 to 2 atomic percent of Ge and/or Cu is most preferably used as the Al—(Ni/Co)—X—Z alloy layer herein.

In a preferred embodiment of the present invention, the transparent pixel electrode includes an indium tin oxide (ITO) (e.g., indium oxide (In $O_3$) further containing about 10 percent by mass of tin oxide (SnO)), and/or an indium zinc oxide (IZO) (e.g., indium oxide further containing about 10 percent by mass of zinc oxide). The transparent pixel electrode especially preferably includes an ITO.

The reflective electrodes according to the present invention can be produced by any of the first, second, and third production methods mentioned in detail later. Each of these methods basically includes the step (Step I) of depositing an Al—(Ni/Co)—X alloy layer through sputter deposition; and the step (Step II) of depositing a transparent pixel electrode through sputter deposition. A feature of the first production method is that an extra step (Step A) is provided after the deposition of the Al—Ni—X alloy layer (Step I) and before the deposition of the transparent pixel electrode (Step II). In Step A, the deposited Al—Ni—X alloy layer is subjected to a heat treatment. In contrast to the first production method, the second and third production methods do not include the heat treatment (Step A). A feature of the second production method is that the deposition atmosphere in the deposition of the transparent pixel electrode is controlled (Step IIa). A feature of the third production method is that another step (Step B) is provided after the deposition of the Al—Ni—X alloy layer (Step I) and before the deposition of the transparent pixel electrode (Step II); and in Step B, the deposited Al—Ni—X alloy layer is subjected to reverse sputtering. The Al—(Ni/Co)—X alloy layer may be the above-mentioned Al—(Ni/Co)—X—Z alloy layer. Any of these Al alloy layers for use in the present invention will be simply generically referred to as an "Al—(Ni/Co)—X—(Z) alloy layer" in the description on the production methods below.

The respective production methods will be illustrated in detail below.

(1) First Production Method

The first production method according to the present invention sequentially includes the steps of:

depositing an Al—(Ni/Co)—X—(Z) alloy layer on or above a substrate through sputter deposition (Step I);

subjecting the deposited Al—(Ni/Co)—X—(Z) alloy layer to a heat treatment at a temperature of 200° C. or higher in an atmosphere of a vacuum or an inert gas (Step A); and depositing a transparent pixel electrode through sputter deposition (Step II).

(Step I)

Initially, an Al—(Ni/Co)—X—(Z) alloy layer (first layer) is deposited through sputter deposition. The deposition process through sputter deposition is not especially limited, as long as being generally used in the deposition typically of Al alloy films. Typically, the deposition is preferably performed in an atmosphere of a vacuum or an inert gas while controlling the pressure to approximately 2 mmTorr and the substrate temperature within a range of from room temperature to about 250° C. The thickness of the Al alloy film is preferably approximately from 50 to 300 nm.

(Step A)

Next, the Al—(Ni/Co)—X—(Z) alloy layer (first layer) deposited in Step I is subjected to a heat treatment at a temperature of 200° C. or higher in an atmosphere of a vacuum or an inert gas. This heat treatment is a step which characterizes the first production method according to the present invention and gives a desired second aluminum oxide layer, i.e., an aluminum oxide layer containing oxygen in a less amount and having a small thickness in its thinnest portion. As is demonstrated in the after-mentioned experimental examples, the desired second layer is not obtained to thereby lower the contact resistance, if the heat treatment is omitted or if the temperature of the heat treatment does not fall within the above-specified range.

Exemplary inert gases for use in the heat treatment include $N_2$ and Ar gases. Each of different inert gases may be used alone or in combination.

The heat treatment temperature is 200° C. or higher (preferably 250° C. or higher) and 400° C. or lower (preferably 350° C. or lower); and the heat treatment time (duration) is 0.5 hour or longer (preferably 1 hour or longer) and 3.5 hours or shorter (preferably 3 hours or shorter). If the heat treatment temperature is excessively low and/or if the heat treatment time is excessively short, the resulting aluminum oxide layer may have a higher oxygen content and a larger thickness in its thinnest portion. In contrast, if the heat treatment temperature is excessively high and/or if the heat treatment time is excessively long, the aluminum-based alloy thin film becomes more susceptible to the occurrence of (nodular protrusions) on its surface.

(Step II)

Finally, a transparent pixel electrode is deposited through sputter deposition. The sputter deposition may be performed by a known suitable process under suitable conditions according to the type of the transparent pixel electrode to be deposited. Typically, when an ITO film is to be deposited, it is preferred to deposit the ITO film to a thickness of approximately 50 to 300 nm in a vacuum atmosphere or an Ar gas or another inert atmosphere while controlling the pressure to approximately 1 mmTorr and the substrate temperature approximately within a range from room temperature to 250° C.

(2) Second Production Method

The second production method according to the present invention sequentially includes:

depositing an Al—(Ni/Co)—X—(Z) alloy layer on or above a substrate through sputter deposition (Step I); and depositing a transparent pixel electrode on the deposited Al—(Ni/Co)—X—(Z) alloy layer through sputter deposition, wherein the sputter deposition is performed in a deposition atmosphere containing a nitrogen component in the early stage of the sputter deposition (Step IIa).

In a comparison between the second production method and the first production method, the second production method does not include the heat treatment step (Step A) which characterizes the first production method; but instead of this, the second production method includes the control of the deposition atmosphere (especially the atmosphere in the early stage of the sputter deposition) in the step of depositing a transparent pixel electrode through sputter deposition (Step II).

Details of the step of depositing an Al—(Ni/Co)—X—(Z) alloy layer through sputter deposition (Step I) in the second production method are as in the first production method.

(Step IIa)

Next, a transparent pixel electrode is deposited through sputter deposition on the Al—(Ni/Co)—X—(Z) alloy layer deposited in Step I. In Step IIa, the sputter deposition is performed in a deposition atmosphere containing a nitrogen component (preferably $N_2$ gas) in the early stage of the sputter deposition. The second production method is characterized by performing the step of depositing a transparent pixel electrode through sputter deposition while appropriately controlling the deposition atmosphere. Other conditions than the deposition atmosphere can be generally employed sputter deposition conditions.

As is described above, containment of a nitrogen component in the deposition atmosphere reduces the oxygen content in the aluminum oxide layer (second layer). In general processes, a film such as an ITO film constituting the transparent pixel electrode is deposited in an Ar gas or another inert gas atmosphere, as is described in (Step II) in the first production method. However, if a transparent pixel electrode is deposited in an inert gas atmosphere, a desired second layer may not be obtained, and the resulting reflective electrode shows a deteriorated contact resistance (see the after-mentioned experimental examples). Though details remain unknown, this is probably because an ITO film containing the nitrogen component (ITO-N film) deposited herein in the early stage of deposition may play a role as a kind of barrier layer and may suppress the interdiffusion between aluminum (Al) and oxygen (O) during a heat treatment performed after the deposition.

As used herein the term "the early stage of the sputter deposition" refers to a stage where a transparent electroconductive oxide film constituting a transparent pixel electrode is deposited to a thickness of about one-fifth to about one-half. Typically, when an ITO film is to be deposited to a thickness of about 50 nm, "the early stage of the sputter deposition" means a stage where the ITO film is deposited to a thickness of approximately 10 to 25 nm. The sputter deposition is preferably performed in a deposition atmosphere containing a nitrogen component in entire stages thereof. The "nitrogen component" is preferably $N_2$ gas. The amount of $N_2$ gas, when used, is such that the ratio of the volume flow rate of $N_2$ gas to that of Ar sputtering gas is preferably 5% to 25%, and more preferably 12% to 18%.

(3) Third Production Method

The third production method according to the present invention sequentially includes the steps of:

depositing an Al—(Ni/Co)—X—(Z) alloy layer on or above a substrate through sputter deposition (Step I);

subjecting the deposited Al—(Ni/Co)—X—(Z) alloy layer to reverse sputtering (Step B); and depositing a transparent pixel electrode through sputter deposition (Step II).

As with the second production method, the third production method does not include the heat treatment step (Step A) which characterizes the first production method. In contrast to the second production method, the third production method is characterized by subjecting the deposited (Ni/Co)—X—(Z) alloy layer to reverse sputtering (Step B) after the deposition of the Al—(Ni/Co)—X—(Z) alloy layer (Step I) and before the deposition of the transparent pixel electrode (Step II).

Details of the step of depositing an Al—(Ni/Co)—X—(Z) alloy layer through sputter deposition (Step I) and the step of deposing a transparent pixel electrode through sputter deposition (Step II) in the third production method are as in the first production method.

(Step B)

In this step, the Al—(Ni/Co)—X—(Z) alloy layer (first layer) deposited in Step I is subjected to reverse sputtering. As used herein the term "reverse sputtering" refers to sputtering in which the voltage applied to a target-side electrode and to a substrate-side electrode is reversed with respect to that in regular sputter deposition; and an ionized inert gas (e.g., Ar ion) is collided not to the target but to the Al—(Ni/Co)—X—(Z) alloy layer on the substrate. The reverse sputtering helps to eliminate an aluminum oxide layer formed on the Al—(Ni/Co)—X—(Z) alloy layer to give a clean Al—Ni—La alloy layer. A transparent pixel electrode is then deposited on the clean Al—Ni—La alloy layer through sputter deposition, whereby the resulting aluminum oxide layer (second layer) contains oxygen in a less amount. This prevents the interdiffusion between aluminum (Al) and oxygen (O) at the interface and, in addition, eliminates contaminants on the surface of the alloy layer.

The reverse sputtering in the third production method according to the present invention is preferably performed, for example, in a vacuum atmosphere or in an inert atmosphere such as Ar atmosphere under controlled conditions at a pressure of approximately 1 mmTorr, a power within a range of approximately from 10 to 100 W, and a substrate temperature within a range of approximately from room temperature to 250° C.

The present invention further includes display devices each provided with any of the reflective electrodes. FIG. 3 is an exemplary cross-sectional view of the principal part of a display device having a reflective electrode 2 according to the present invention. With reference to FIG. 3, the reflective electrode 2 according to the present invention is present between a transparent pixel electrode 3 and a substrate 1 in a region where a second aluminum oxide layer 2b and the transparent pixel electrode 3 are directly connected to each other. One or more other layers, such as an insulating film, may be present between the reflective electrode 2 and the substrate 1. It should be noted that the display device in FIG. 3 is illustrated as an embodiment of the present invention; but display devices according to the present invention are not limited to the embodiment in FIG. 3.

EXAMPLES

The present invention will be illustrated in further detail with reference to several working examples (experimental examples) below. It should be noted, however, that these examples are never intended to limit the scope of the present invention; various alternations and modifications may be made without departing from the scope and spirit of the present invention and are all included within the technical scope of the present invention.

Experimental Example 1

The first production method was investigated in this experimental example.

Specifically, a series of layer of Al—Ni—La alloys as materials for a reflective electrode was deposited through sputter deposition each on an alkali-free glass plate (thickness (gauge) 0.7 mm) substrate. The sputter deposition was performed under conditions of an Ar atmosphere at a pressure of 1 mTorr and a power of 100 W. In each sample, the thickness of the Al—Ni—La alloy layer was controlled to be about 100 nm. The Ni contents and La contents in the Al—Ni—La alloy layers are shown in Table 1.

Next, samples of the Al—Ni—La alloy layers were divided into two groups, i.e., those subjected to a heat treatment and those not subjected to a heat treatment. The heat treatment was performed at a temperature given in Table 1 in a vacuum atmosphere (with a degree of vacuum of equal to or less than $3 \times 10^{-4}$ Pa) or in a $N_2$ atmosphere for 1 hour.

Next, non-treated and heat-treated Al—Ni—La alloy layers were patterned through photolithography and etching, and an ITO film was deposited thereon through sputter deposition. The sputter deposition was performed under conditions of an Ar atmosphere at a pressure of 1 mTorr and a power of 100 W. In each sample, the thickness of the ITO film (transparent pixel electrode) was controlled to be about 50 nm.

(Contact Resistance)

Patterns for contact resistance measurement (contact area: 20-, 40-, or 80-μm square) were patterned through photolithography and etching on each of the reflective electrode samples prepared as above, subjected to a heat treatment in a nitrogen atmosphere at 177° C. (450K) for 1 hour, and contact resistances were measured according to the four-terminal Kelvin method. The results are shown in Table 1.

([O]/[Al] Ratio and Thickness in Thinnest Portion of Aluminum Oxide Layer)

Figure 4:
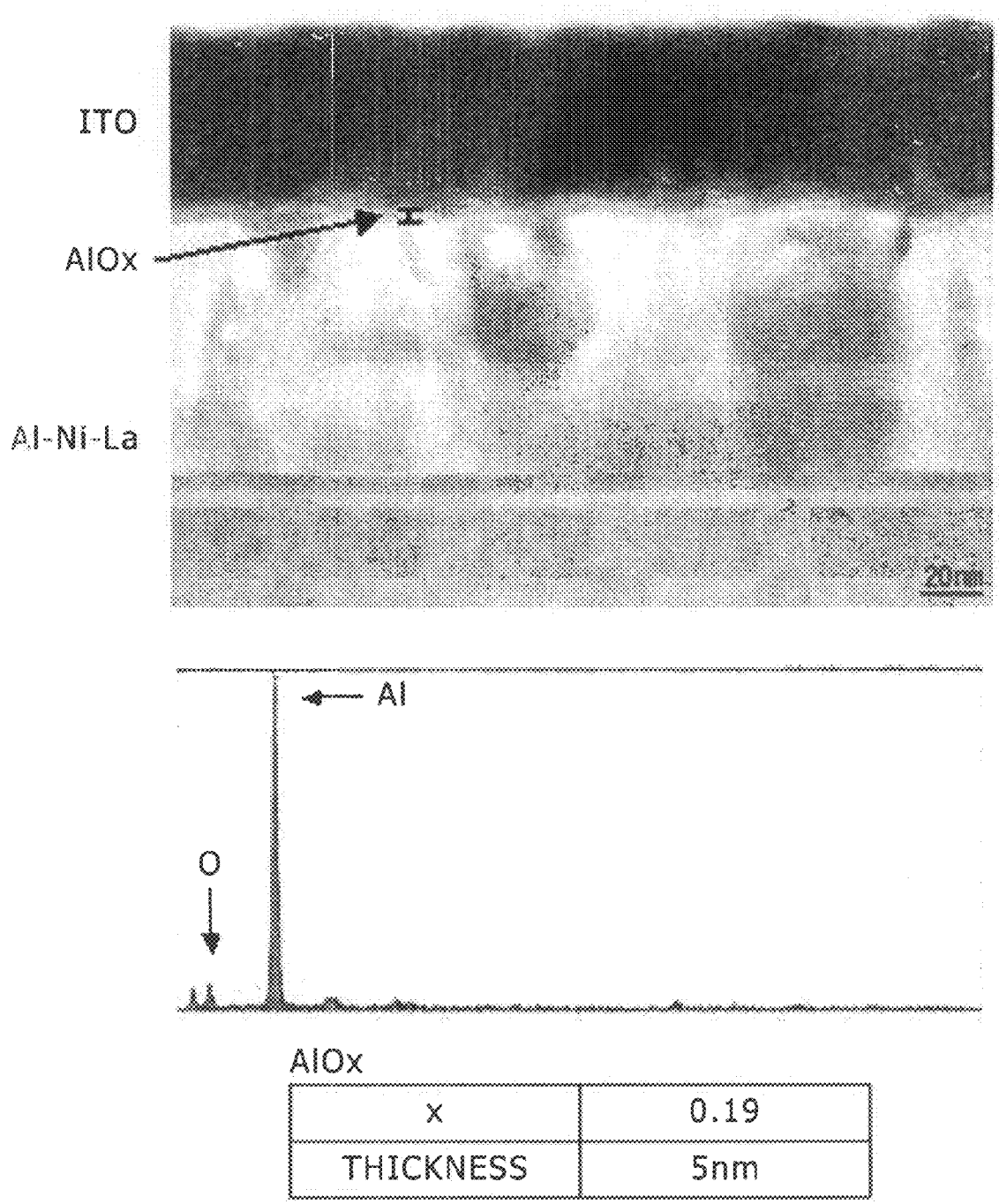
FIG. 4 is a transmission electron micrograph showing the interface between a reflective electrode and an ITO film as Sample No. 27 (sample according to the present invention, with heat treatment) in Experimental Example 1.
Figure 5:
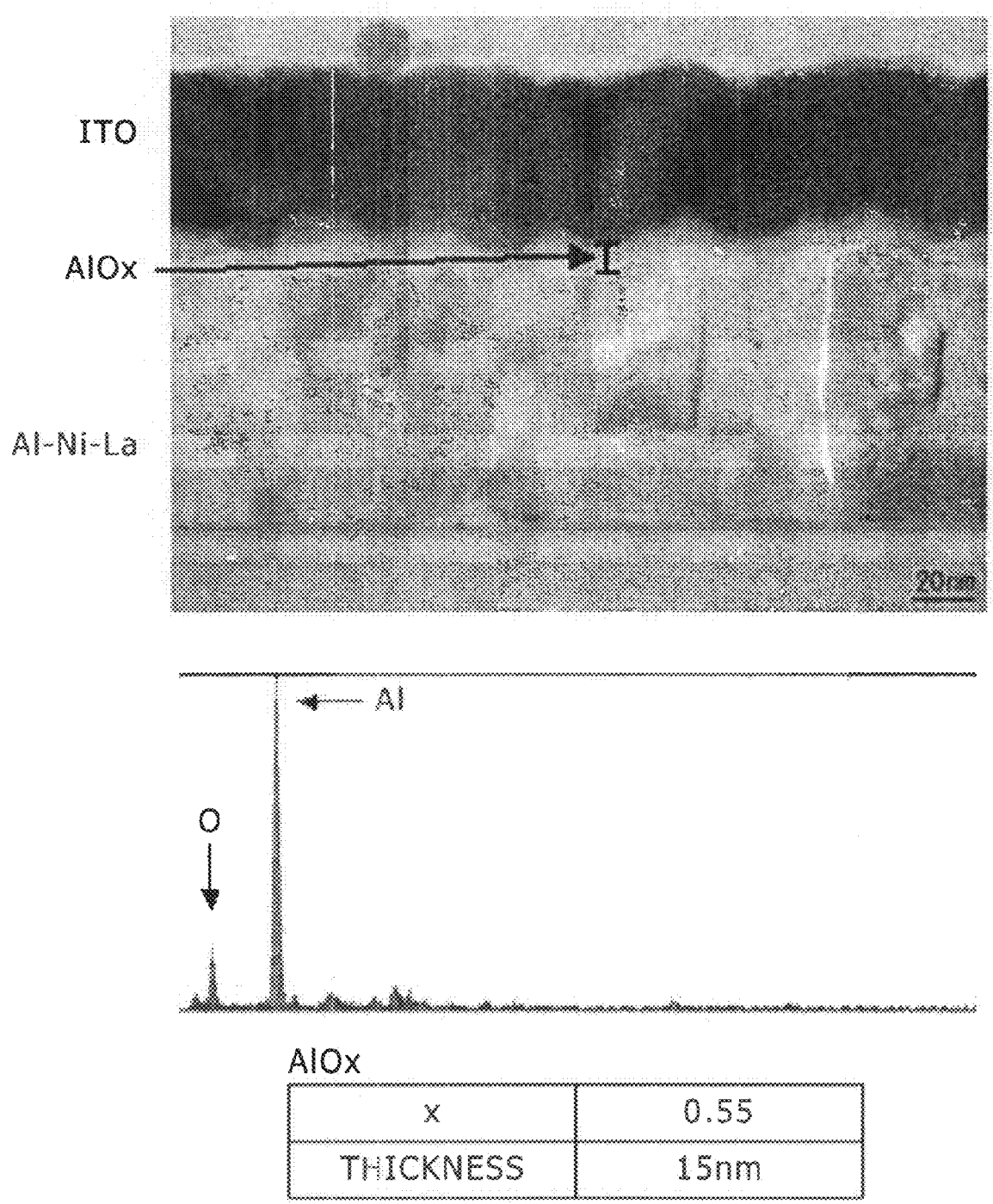
FIG. 5 is a transmission electron micrograph showing the interface between a reflective electrode and an ITO film as Sample No. 2 (comparative sample, without heat treatment) in Experimental Example 1.

(1) In Sample No. 2 (without heat treatment) and No. 27 (heat-treated at 200° C. in a $N_2$ atmosphere) in Table 1, the interface between the first layer (Al-(2.0 atomic percent Ni)-(0.35 atomic percent La) alloy layer) and the ITO film was observed with a transmission electron microscope (Model HF2000 supplied by Hitachi, Ltd.), and the thickness of the aluminum oxide layer in its thinnest portion was determined (observed area: about 10 μm, magnification in observation: $15 \times 10^4$ times). In addition, the compositions of the aluminum oxide layers of these samples were measured through electron excited characteristic X-ray analysis. The results of these determinations are shown in Table 1, and FIGS. 4 and 5.

(2) Of the other samples (other samples than Samples Nos. 2 and 27 in Table 1), the compositions ([O]/[Al] ratios) and thicknesses of the aluminum oxide layers in their thinnest portions were measured through X-ray photoelectric spectrometry. The results are shown in Table 1.

TABLE 1

| Sample No. | Al alloy layer*1 Ni (%) | Al alloy layer*1 La (%) | Heat treatment Atmosphere | Heat treatment Temperature (° C.) | Oxide layer [O]/[Al] | Oxide layer Thickness in thinnest portion (nm) | Contact resistance (μΩ/cm²) |
|---|---|---|---|---|---|---|---|
| 1 | 2.0 | 0.35 | — | — | 0.55 | 14 | 800-1200 |
| 2 | 2.0 | 0.35 | — | — | 0.55 | 15 | 600-900 |
| 3 | 2.0 | 0.35 | — | — | 0.55 | 20 | 500-600 |
| 4 | 1.0 | 0.35 | — | — | 0.45 | 12 | 600-700 |
| 5 | 1.0 | 0.35 | — | — | 0.45 | 15 | 700-1300 |
| 6 | 1.0 | 0.35 | — | — | 0.45 | 14 | 800-1100 |
| 7 | 0.5 | 0.10 | — | — | 0.34 | 22 | 2000-2800 |
| 8 | 0.5 | 0.10 | — | — | 0.34 | 14 | 700-800 |
| 9 | 0.5 | 0.10 | — | — | 0.34 | 13 | 600-1200 |
| 10 | 0.5 | 0.10 | vacuum | 150 | 0.32 | 17 | 500-600 |
| 11 | 1.0 | 0.35 | vacuum | 150 | 0.32 | 18 | 200-300 |
| 12 | 2.0 | 0.35 | vacuum | 150 | 0.33 | 18 | 200-600 |
| 13 | 0.5 | 0.10 | vacuum | 200 | 0.29 | 9 | 30-40 |
| 14 | 1.0 | 0.35 | vacuum | 200 | 0.29 | 8 | 30-40 |
| 15 | 2.0 | 0.35 | vacuum | 200 | 0.27 | 8 | 20-30 |
| 16 | 0.5 | 0.10 | vacuum | 250 | 0.25 | 9 | 20-30 |
| 17 | 1.0 | 0.35 | vacuum | 250 | 0.16 | 8 | 20-40 |
| 18 | 2.0 | 0.35 | vacuum | 250 | 0.13 | 7 | 20-30 |
| 19 | 0.5 | 0.10 | vacuum | 300 | 0.22 | 7 | 20-40 |
| 20 | 1.0 | 0.35 | vacuum | 300 | 0.19 | 5 | 20-30 |
| 21 | 2.0 | 0.35 | vacuum | 300 | 0.18 | 5 | 20-30 |

TABLE 1-continued

| | Al alloy layer*[1] | | Heat treatment | | Oxide layer | | Contact |
|---|---|---|---|---|---|---|---|
| Sample No. | Ni (%) | La (%) | Atmosphere | Temperature (° C.) | [O]/[Al] | Thickness in thinnest portion (nm) | resistance ($\mu\Omega/cm^2$) |
| 22 | 0.5 | 0.10 | $N_2$ | 150 | 0.33 | 13 | 400-500 |
| 23 | 1.0 | 0.35 | $N_2$ | 150 | 0.32 | 16 | 500-700 |
| 24 | 2.0 | 0.35 | $N_2$ | 150 | 0.35 | 18 | 600-900 |
| 25 | 0.5 | 0.10 | $N_2$ | 200 | 0.22 | 7 | 50-60 |
| 26 | 1.0 | 0.35 | $N_2$ | 200 | 0.24 | 8 | 60-70 |
| 27 | 2.0 | 0.35 | $N_2$ | 200 | 0.19 | 5 | 40-60 |
| 28 | 0.5 | 0.10 | $N_2$ | 250 | 0.13 | 5 | 20-30 |
| 29 | 1.0 | 0.35 | $N_2$ | 250 | 0.20 | 7 | 20-40 |
| 30 | 2.0 | 0.35 | $N_2$ | 250 | 0.25 | 8 | 20-50 |
| 31 | 0.5 | 0.10 | $N_2$ | 300 | 0.23 | 7 | 20-50 |
| 32 | 1.0 | 0.35 | $N_2$ | 300 | 0.22 | 8 | 50-60 |
| 33 | 2.0 | 0.35 | $N_2$ | 300 | 0.19 | 8 | 30-40 |

*[1]in unit of atomic percent; with the remainder being Al and inevitable impurities The results in Table 1 demonstrate as follows. Samples Nos. 13 to 21 and 25 to 33 each had been subjected to a heat treatment in an atmosphere of a vacuum or inert gas (nitrogen) at a temperature of 200° C. or higher. These samples each included an aluminum oxide layer having an [O]/[Al] ratio of 0.30 or less and a thickness in its thinnest portion of 10 nm or less and showed satisfactory contact resistances of 100 $\mu\Omega/cm^2$ or less (70 $\mu\Omega/cm^2$ or less in samples according to the present invention (Examples) in Experimental Example 1).

In contrast, Samples Nos. 1 to 9 had not been subjected to a heat treatment; and Samples Nos. 10 to 12 and 22 to 24 had been subjected to a heat treatment at a low temperature. These samples each included an oxide layer having an excessively high [O]/[Al] ratio and an excessively large thickness in its thinnest portion and showed high contact resistances of 200 $\mu\Omega/cm^2$ or more.

As compared in transmission electron micrograph to non-treated Sample No. 2 (Comparative Example, FIG. 5), heat-treated Sample No. 27 (Example, FIG. 4) had a smoother aluminum oxide layer ($AlO_x$). This is probably because an aluminum oxide layer having an [O]/[Al] ratio of 0.30 or less was formed to impede the interdiffusion between aluminum (Al) and oxygen (O) during the deposition of ITO film.

Experimental Example 2

The second production method was investigated in this experimental example.

Specifically, samples according to the present invention (Examples) were prepared by depositing an Al—Ni—La alloy layer (thickness: about 100 nm) and an ITO film (thickness: about 50 nm) on an alkali-free glass plate (thickness (gauge) 0.7 mm) by the procedure of Experimental Example 1, except for not performing a heat treatment but performing the deposition of ITO while using an Ar sputtering gas further containing 12% of $N_2$ gas in terms of ratio by volume flow rate. For comparison, comparative samples (Comparative Examples) were prepared by performing the deposition of ITO in an atmosphere of Ar gas alone.

Of these samples according to the present invention and comparative samples, the contact resistance, and the [O]/[Al] ratios and thickness in its thinnest portion of the aluminum oxide layer were measured by the procedure of Experimental Example 1.

As a result, the samples according to the present invention whose ITO film had been deposited in the presence of $N_2$ gas had thicknesses of the oxide layer (second layer) in its thinnest portion of 8 nm, [O]/[Al] ratios in the oxide layer of 0.15, and contact resistances of from 50 to 70 $\mu\Omega/cm^2$. In contrast, the comparative samples whose ITO film had been deposited in the absence of $N_2$ gas had thicknesses of the oxide layers (second layer) in its thinnest portion of 18 nm, [O]/[Al] ratios of the oxide layer of 0.35, and contact resistances of from 500 to 800 $\mu\Omega/cm$.

Experimental Example 3

The third production method was investigated in this experimental example.

Specifically, an Al—Ni—La alloy layer (thickness: about 100 nm) and an ITO film (thickness: about 50 nm) were deposited on an alkali-free glass plate (thickness (gauge) 0.7 mm) by the procedure of Experimental Example 1, except for not performing the heat treatment. Instead of the heat treatment, samples were placed in a sputter deposition system for ITO film, Ar gas was introduced in the system, and the sample surfaces were subjected to reverse sputtering with Ar for 10 seconds while changing (reversing) the polarity of sputtering. The reverse sputtering was performed under conditions of Ar atmosphere at a pressure of 1 mmTorr and a power of 100 W. Thereafter the polarity of sputtering was turned back, and an ITO film was deposited by the procedure of Experimental Example 1 and thereby yielded samples according to the present invention. For comparison, comparative samples were prepared without performing reverse sputtering.

Of these samples according to the present invention and comparative samples, the contact resistance, and the [O]/[Al] ratio and thickness in its thinnest portion of the aluminum oxide layer were measured by the procedure of Experimental Example 1.

The samples according to the present invention which had been subjected to reverse sputtering had thicknesses of the oxide layer (second layer) in its thinnest portion of 7 nm, [O]/[Al] ratios in the oxide layer of 0.17, and contact resistances of from 40 to 80 $\mu\Omega/cm^2$. In contrast, the comparative samples which had not been subjected to reverse sputtering had thicknesses of the oxide layer (second layer) in its thinnest portion of 18 nm, [O]/[Al] ratios in the oxide layer of 0.55, and contact resistances of from 2000 to 2800 $\mu\Omega/cm^2$.

Experimental Example 4

The following samples differing with each other only in Ni content as in Table 1 were used in this experimental example.

These are all samples (Examples) prepared by the first production method according to the present invention.

Examples of Al-0.5% Ni-0.10% La alloys: Samples No. 22 (heat treatment temperature: 150° C.), No. 25 (heat treatment temperature: 200° C.), and No. 28 (heat treatment temperature: 250° C.)

Examples of Al-1.0% Ni-0.35% La alloys: Samples No. 23 (heat treatment temperature: 150° C.), No. 26 (heat treatment temperature: 200° C.), and No. 29 (heat treatment temperature: 250° C.)

Examples of Al-2.0% Ni-0.35% La alloys: Samples No. 24 (heat treatment temperature: 150° C.), No. 27 (heat treatment temperature: 200° C.), and No. 30 (heat treatment temperature: 250° C.)

Using the samples, reflectances were compared between the reflectance immediately after deposition (before heating treatment) and the reflectance after heating in vacuo (heating at 200° C., 220° C., and 250° C., respectively, for 30 minutes). The reflectances were measured as spectral reflectances at measurement wavelengths ranging from 1000 to 250 nm with the UV/Vis Spectrophotometer "V-570" supplied by JASCO. Specifically, the intensities of reflected light from the sample were measured with respect to the intensity of the reflected light from a reference mirror and these were defined as the "spectral reflectances".

FIGS. 6, 7, 8, and 9 are graphs showing how the reflectances (at wavelengths of from 850 to 250 nm) vary in the respective samples immediately after deposition, those after heating at 200° C. in vacuo, those after heating at 220° C. in vacuo, and those after heating at 250° C. in vacuo. With reference to the reflectance at 550 nm, all the samples satisfying the conditions specified in the present invention had reflectances at 550 nm of more than 85" to around 90' and had satisfactory reflection properties both immediately after deposition and after heating in vacuo.

Experimental Example 5

This experimental example is a modification of Experimental Example 1, except for using Al—Ni—La—Cu alloy layers as the Al alloy layer. Specifically, a series of reflective electrode samples was prepared by the procedure of Experimental Example 1, except for using Al—Ni—La—Cu alloy layers having the compositions given in Table 2 instead of the Al—Ni—La alloy layers used in Experimental Example 1 and having the compositions given in Table 1, and except for carrying out heat treatments given in Table 2. Next, the value of contact resistance, thickness of the aluminum oxide layer in its thinnest portion, and ratio of oxygen to aluminum ([O]/[Al] ratios) were determined by the procedure of Experimental Example 1. The results are also shown in Table 2 below.

TABLE 2

| Sample No. | Al alloy layer*[1] | | | Heat treatment | | Oxide layer | | Contact resistance ($\mu\Omega/cm^2$) |
|---|---|---|---|---|---|---|---|---|
| | Ni (%) | La (%) | Cu (%) | Atmosphere | Temperature (° C.) | [O]/[Al] | Thickness in thinnest portion (nm) | |
| 1 | 0.5 | 0.10 | 0.5 | vacuum | 150 | 0.32 | 16 | 400-500 |
| 2 | 1.0 | 0.35 | 0.5 | vacuum | 150 | 0.31 | 16 | 100-500 |
| 3 | 2.0 | 0.35 | 0.5 | vacuum | 150 | 0.32 | 15 | 100-200 |
| 4 | 0.5 | 0.10 | 0.5 | vacuum | 200 | 0.28 | 8 | 20-30 |
| 5 | 1.0 | 0.35 | 0.5 | vacuum | 200 | 0.28 | 7 | 20-30 |
| 6 | 2.0 | 0.35 | 0.5 | vacuum | 200 | 0.26 | 6 | 10-20 |
| 7 | 0.5 | 0.10 | 0.5 | vacuum | 250 | 0.24 | 6 | 10-20 |
| 8 | 1.0 | 0.35 | 0.5 | vacuum | 250 | 0.16 | 7 | 10-30 |
| 9 | 2.0 | 0.35 | 0.5 | vacuum | 250 | 0.13 | 5 | 10-20 |
| 10 | 0.5 | 0.10 | 0.5 | vacuum | 300 | 0.22 | 7 | 10-30 |
| 11 | 1.0 | 0.35 | 0.5 | vacuum | 300 | 0.12 | 5 | 10-20 |
| 12 | 2.0 | 0.35 | 0.5 | vacuum | 300 | 0.11 | 5 | 10-20 |
| 13 | 0.5 | 0.10 | 0.5 | $N_2$ | 150 | 0.33 | 12 | 300-400 |
| 14 | 1.0 | 0.35 | 0.5 | $N_2$ | 150 | 0.32 | 15 | 500-800 |
| 15 | 2.0 | 0.35 | 0.5 | $N_2$ | 150 | 0.33 | 14 | 400-600 |
| 16 | 0.5 | 0.10 | 0.5 | $N_2$ | 200 | 0.29 | 9 | 40-50 |
| 17 | 1.0 | 0.35 | 0.5 | $N_2$ | 200 | 0.29 | 8 | 50-60 |
| 18 | 2.0 | 0.35 | 0.5 | $N_2$ | 200 | 0.28 | 7 | 30-50 |
| 19 | 0.5 | 0.10 | 0.5 | $N_2$ | 250 | 0.25 | 7 | 10-20 |
| 20 | 1.0 | 0.35 | 0.5 | $N_2$ | 250 | 0.18 | 8 | 10-40 |
| 21 | 2.0 | 0.35 | 0.5 | $N_2$ | 250 | 0.15 | 6 | 10-30 |
| 22 | 0.5 | 0.10 | 0.5 | $N_2$ | 300 | 0.22 | 7 | 10-40 |
| 23 | 1.0 | 0.35 | 0.5 | $N_2$ | 300 | 0.15 | 6 | 10-40 |
| 24 | 2.0 | 0.35 | 0.5 | $N_2$ | 300 | 0.13 | 6 | 10-30 |

*[1] in unit of atomic percent; with the remainder being Al and inevitable impurities The results in Table 2 demonstrate as follows. Samples Nos. 4 to 12 and Nos. 16 to 24, which had been subjected to a heat treatment at a temperature of 200° C. or higher in an atmosphere of a vacuum or inert gas (nitrogen), each included an aluminum oxide layer having an [O]/[Al] ratio of 0.30 or less and a thickness in its thinnest portion of 10 nm or less. Each of these samples had low contact resistance of a value of about 60 $\mu\Omega$/cm or less.

In contrast, Samples Nos. 1 to 3 and Nos. 13 to 15, which had been subjected to a heat treatment at a low temperature, each included an aluminum oxide layer having an excessively high [O]/[Al] ratio and an excessively large thickness in its thinnest portion. Each of these samples had a contact resistance of 100 $\mu\Omega$/cm or more, being higher than those of the samples subjected to a suitable heat treatment.

Experimental Example 6

This experimental example is a further modification of Experimental Example 1, except for using Al—(Ni/Co)—

La—Ge alloy layers (Ge content including 0 atomic percent) as the Al alloy layer. In this experimental example, the compositions of the Al alloys were set so as to demonstrate effects of the addition of germanium (Ge). Effects of the addition of Ge were investigated particularly when the (Ni/Co) content was set to be relatively low of 0.2 atomic percent but within the range specified in the present invention (0.1 to 2 atomic percent). Specifically, how germanium helps to further reduce the contact resistance was investigated.

Specifically, a series of reflective electrode samples was prepared by the procedure of Experimental Example 1, except for using Al—Ni—La—Ge alloy layers or Al—Co—La—Ge alloy layers (the Ge content including 0 atomic percent in any of alloy layers) having the compositions given in Table 3 instead of the Al—Ni—La alloy layers used in Experimental Example 1 and having the compositions given in Table 1, and except for carrying out heat treatments given in Table 3. In Table 3, the symbol "Ni/Co" refers to that either Ni or Co was added.

Next, the value of contact resistance, thickness of the aluminum oxide layer in its thinnest portion, and ratio of oxygen to aluminum ([O]/[Al] ratio) were determined by the procedure of Experimental Example 1. The results are also shown in Table 3 below.

In this experimental example, tests were conducted also on Al alloys not containing Ge (e.g., Sample No. 1 in Table 3) so as to demonstrate effects of the addition of Ge, as is mentioned above. There is an overlap in composition and heat treatment temperature between some of these samples and the samples in Table 1. For example, Sample No. 2 in Table 3 is identical to Sample No. 10 in Table 1 in Al alloy composition and heat treatment temperature. Accordingly, experimental results (properties of the oxide layer and the contact resistance as shown in the tables) using the same samples under the same conditions are supposed to be fully identical with each other. However, the results of some samples are not fully identical with each other, as the ranges of the contact resistance somewhat deviate from each other. Typically, Sample No. 11 in Table 1 and Sample No. 4 in Table 3 differ from each other in the upper limit of the range of contact resistance. This is because there may be some deviation in the range of contact resistance when measured under conditions in this experimental example. However, it has been experimentally verified that all samples satisfying the requirements (conditions) specified in the present invention surely have satisfactory properties even in consideration typically of the experimental errors.

TABLE 3

| | Al alloy layer[*1] | | | Heat treatment | | Oxide layer | | Contact |
| Sample No. | Ni/Co (%) | La (%) | Ge (%) | Atmosphere | Temperature (° C.) | [O]/[Al] | Thickness in thinnest portion (nm) | resistance ($\mu\Omega/cm^2$) |
| --- | --- | --- | --- | --- | --- | --- | --- | --- |
| 1 | 0.2 | 0.20 | — | vacuum | 150 | 0.35 | 19 | 700-1000 |
| 2 | 0.5 | 0.10 | — | vacuum | 150 | 0.32 | 17 | 500-600 |
| 3 | 0.2 | 0.20 | 0.5 | vacuum | 150 | 0.31 | 13 | 300-600 |
| 4 | 1.0 | 0.35 | — | vacuum | 150 | 0.32 | 18 | 200-600 |
| 5 | 2.0 | 0.35 | — | vacuum | 150 | 0.33 | 18 | 200-300 |
| 6 | 0.2 | 0.20 | — | vacuum | 200 | 0.30 | 10 | 600-900 |
| 7 | 0.5 | 0.10 | — | vacuum | 200 | 0.29 | 9 | 30-40 |
| 8 | 0.2 | 0.20 | 0.5 | vacuum | 200 | 0.27 | 7 | 20-30 |
| 9 | 1.0 | 0.35 | — | vacuum | 200 | 0.29 | 8 | 30-40 |
| 10 | 2.0 | 0.35 | — | vacuum | 200 | 0.27 | 8 | 20-30 |
| 11 | 0.2 | 0.20 | — | vacuum | 250 | 0.28 | 10 | 500-800 |
| 12 | 0.5 | 0.10 | — | vacuum | 250 | 0.25 | 9 | 20-30 |
| 13 | 0.2 | 0.20 | 0.5 | vacuum | 250 | 0.11 | 6 | 20-30 |
| 14 | 1.0 | 0.35 | — | vacuum | 250 | 0.16 | 8 | 20-40 |
| 15 | 2.0 | 0.35 | — | vacuum | 250 | 0.13 | 7 | 20-30 |
| 16 | 0.2 | 0.20 | — | vacuum | 300 | 0.26 | 9 | 200-400 |
| 17 | 0.5 | 0.10 | — | vacuum | 300 | 0.22 | 7 | 20-40 |
| 18 | 0.2 | 0.20 | 0.5 | vacuum | 300 | 0.11 | 5 | 20-30 |
| 19 | 1.0 | 0.35 | — | vacuum | 300 | 0.19 | 5 | 20-30 |
| 20 | 2.0 | 0.35 | — | vacuum | 300 | 0.18 | 5 | 20-30 |
| 21 | 0.2 | 0.20 | — | $N_2$ | 150 | 0.36 | 14 | 900-1500 |
| 22 | 0.5 | 0.10 | — | $N_2$ | 150 | 0.33 | 13 | 400-500 |
| 23 | 0.2 | 0.20 | 0.5 | $N_2$ | 150 | 0.34 | 13 | 400-600 |
| 24 | 1.0 | 0.35 | — | $N_2$ | 150 | 0.32 | 16 | 600-900 |
| 25 | 2.0 | 0.35 | — | $N_2$ | 150 | 0.35 | 18 | 500-700 |
| 26 | 0.2 | 0.20 | — | $N_2$ | 200 | 0.30 | 10 | 700-1000 |
| 27 | 0.5 | 0.10 | — | $N_2$ | 200 | 0.22 | 7 | 50-60 |
| 28 | 0.2 | 0.20 | 0.5 | $N_2$ | 200 | 0.29 | 7 | 50-60 |
| 29 | 1.0 | 0.35 | — | $N_2$ | 200 | 0.24 | 8 | 60-70 |
| 30 | 2.0 | 0.35 | — | $N_2$ | 200 | 0.19 | 5 | 40-60 |
| 31 | 0.2 | 0.20 | — | $N_2$ | 250 | 0.29 | 10 | 600-900 |
| 32 | 0.5 | 0.10 | — | $N_2$ | 250 | 0.13 | 5 | 20-30 |
| 33 | 0.2 | 0.20 | 0.5 | $N_2$ | 250 | 0.12 | 6 | 20-40 |
| 34 | 1.0 | 0.35 | — | $N_2$ | 250 | 0.20 | 7 | 20-50 |
| 35 | 2.0 | 0.35 | — | $N_2$ | 250 | 0.25 | 8 | 20-40 |
| 36 | 0.2 | 0.20 | — | $N_2$ | 300 | 0.28 | 8 | 300-500 |
| 37 | 0.5 | 0.10 | — | $N_2$ | 300 | 0.23 | 7 | 20-50 |
| 38 | 0.2 | 0.20 | 0.5 | $N_2$ | 300 | 0.10 | 6 | 20-40 |
| 39 | 1.0 | 0.35 | — | $N_2$ | 300 | 0.22 | 8 | 20-50 |
| 40 | 2.0 | 0.35 | — | $N_2$ | 300 | 0.19 | 8 | 20-40 |

[*1] in unit of atomic percent; with the remainder being Al and inevitable impurities The experimental results of Al—Ni—La—Ge alloy layers and Al—Co—La—Ge alloy layers are shown not separately but collectively as "Ni/Co" in Table 3. This is because the experimental results were identical when either Ni or Co was used, in respect of the experimental results ([O]/[Al] ratio and thickness of the oxide layer in its thinnest portion, and contact resistance) in Table 3.

Table 3 demonstrates that Samples Nos. 6 to 20 and Nos. 26 to 40, which had been subjected to a heat treatment at a temperature of 200° C. or higher in an atmosphere of a vacuum or inert gas (nitrogen), each included an aluminum oxide layer having an [O]/[Al] ratio of 0.30 or less and a thickness in its thinnest portion of 10 nm or less. These samples showed low contact resistance of a value of at highest 1000 μΩ/cm or less.

Of the samples, effects of the addition of Ge on the contact resistance were discussed below while focusing attention particularly on the content of "Ni/Co". Samples Nos. 6, 11, and 16 (these are samples heat-treated in a vacuum atmosphere) and Nos. 26, 31, and 36 (these are samples heat-treated in a $N_2$ atmosphere) in Table 3 are examples each using an Al alloy having a relatively low "Ni/Co" content of 0.2 atomic percent but within the range specified in the present invention and containing no Ge, and these samples had been subjected to a heat treatment under suitably controlled conditions. These samples had contact resistances which satisfy an acceptability criterion in this experimental example but are relatively high whose lower limit is at lowest of about 200 μΩ/cm, as shown in Table 3. In contrast, Samples Nos. 8, 13, and 18 (these are samples heat-treated in a $N_2$ atmosphere) and Nos. 28, 33, and 38 (these are samples heat-treated in a $N_2$ atmosphere) in Table 3 used Al alloys corresponding to those of the above-mentioned samples, except for further containing 0.5 atomic percent of Ge, and had been subjected to a heat treatment under the same conditions as above-mentioned samples. These samples containing Ge showed remarkably lower contact resistances as compared to the corresponding samples containing no Ge and had very low values of contact resistance of 60 μΩ/cm or less.

The experimental results demonstrate that the addition of Ge effectively lowers the contact resistance particularly when the Al alloys contain a relatively small content of Ni/Co.

While the present invention has been illustrated in detail with reference to certain embodiments, those skilled in the art will recognize that various modifications and changes are possible without departing from the spirit and scope of the present invention.

This application is based on a Japanese patent application filed on Dec. 26, 2007 (Japanese Patent Application No. 2007-335003) and a Japanese patent application filed on Dec. 19, 2008 (Japanese Patent Application No. 2008-324373), entire contents of which are incorporated herein by reference.

Industrial Applicability

The reflective electrodes according to the present invention each have an aluminum oxide layer containing 0 (oxygen) in a less amount and being thin in a contact area with the transparent pixel electrode. They therefore excel in all properties such as reflection properties, contact resistance, electric resistivity, and thermal stability, even when the aluminum oxide layer constituting the reflective electrodes is directly connected to an electroconductive oxide film constituting a transparent electrode without the interposition of a barrier metal layer, in contrast to common techniques. Specifically, for example, the reflective electrodes have high reflectances and low contact resistances and do not cause defects such as hillocks even after subjected to a heat treatment at a relatively low temperature of about 100° C. or higher and 300° C. or lower. Accordingly, the reflective electrodes according to the present invention, when used, can provide display devices having excellent productivity, being inexpensive, and showing high performance.

The invention claimed is:

1. A display device comprising a reflective electrode arranged on or above a substrate and in direct connection with a transparent pixel electrode, wherein the reflective electrode comprises:
   a first Al—(Ni/Co)—X alloy layer containing:
      0.1 to 2 atomic percent of at least one of nickel (Ni) and cobalt (Co), and
      0.1 to 2 atomic percent of X, wherein X is at least one element selected from the group consisting of La, Mg, Mn, Ru, Rh, Pt, Pd, Ir, Ce, Pr, Gd, Tb, Dy, Nb, Mo, W, Eu, Ho, Er, Tm, Yb, and Lu; and
   a second aluminum oxide layer containing aluminum (Al) and oxygen (O),
   wherein the second aluminum oxide layer is directly connected to the transparent pixel electrode,
   wherein the second aluminum oxide layer has a ratio [O]/[Al] of the number of oxygen atoms to the number of aluminum atoms of 0.30 or less,
   wherein the second aluminum oxide layer has a thickness in its thinnest portion of 10 nm or less, and
   wherein the contact resistance between the reflective electrode and the transparent pixel electrode is 100 μΩ/cm$^2$ or less.

2. The display device of claim 1, wherein the first Al—(Ni/Co)—X alloy layer contains 0.1 to 2 atomic percent of Ni.

3. The display device of claim 1, wherein the first Al—(Ni/Co)—X alloy layer contains 0.1 to 2 atomic percent of at least one of Ni and Co; and 0.1 to 2 atomic percent of lanthanum (La).

4. The display device of claim 3, wherein the first Al—(Ni/Co)—X alloy layer contains 0.1 to 2 atomic percent of Ni and 0.1 to 2 atomic percent of La.

5. The display device of claim 1, wherein the first Al—(Ni/Co)—X alloy layer further contains 0.1 to 2 atomic percent of Z, wherein Z is at least one element selected from the group consisting of germanium (Ge), copper (Cu), and silicon (Si).

6. The display device of claim 5, wherein the first Al—(Ni/Co)—X alloy layer contains 0.1 to 2 atomic percent of at least one of Ni and Co; 0.1 to 2 atomic percent of La; and 0.1 to 2 atomic percent of at least one of Ge and Cu.

7. The display device of claim 1, wherein the transparent pixel electrode comprises at least one of an indium tin oxide (ITO) and an indium zinc oxide (IZO).

8. A method for producing the display device of claim 1, the method sequentially comprising:
   depositing an Al—(Ni/Co)—X alloy layer on or above a substrate through sputter deposition;
   subjecting the deposited Al—(Ni/Co)—X alloy layer to a heat treatment at a temperature of 200° C. or higher in an atmosphere of a vacuum or an inert gas; and
   depositing a transparent pixel electrode through sputter deposition.

9. A method for producing the display device of claim 1, the method sequentially comprising:
   depositing an Al—(Ni/Co)—X alloy layer on or above a substrate through sputter deposition; and
   depositing a transparent pixel electrode on or above the deposited Al—(Ni/Co)—X alloy layer through sputter deposition, wherein the sputter deposition is performed in a deposition atmosphere containing a nitrogen component at least in the early stage of the sputter deposition.

10. A method for producing the display device of claim 1, the method sequentially comprising:
- depositing an Al—(Ni/Co)—X alloy layer on or above a substrate through sputter deposition;
- subjecting the deposited Al—(Ni/Co)—X alloy layer to reverse sputtering; and
- depositing a transparent pixel electrode through sputter deposition.

11. The method of claim 8, wherein the Al—(Ni/Co)—X alloy layer further contains 0.1 to 2 atomic percent of Z, wherein Z is at least one element selected from the group consisting of Ge, Cu, and Si.

12. The method of claim 9, wherein the Al—(Ni/Co)—X alloy layer further contains 0.1 to 2 atomic percent of Z, wherein Z is at least one element selected from the group consisting of Ge, Cu, and Si.

13. The method of claim 10, wherein the Al—(Ni/Co)—X alloy layer further contains 0.1 to 2 atomic percent of Z, wherein Z is at least one element selected from the group consisting of Ge, Cu, and Si.

14. The display device of claim 1, wherein the contact resistance between the reflective electrode and the transparent pixel electrode is 70 $\mu\Omega/cm^2$ or less.

15. The display device of claim 1, wherein the contact resistance between the reflective electrode and the transparent pixel electrode is 70 $\mu\Omega/cm^2$ or less and the second aluminum oxide layer has a ratio [O]/[Al] of the number of oxygen atoms to the number of aluminum atoms of 0.13 to 0.29.

16. The display device of claim 1, wherein the first Al—(Ni/Co)—X alloy layer consists essentially of an Al—Co—X alloy layer.

* * * * *